(12) United States Patent
Futase

(10) Patent No.: US 7,964,500 B2
(45) Date of Patent: Jun. 21, 2011

(54) METHOD OF MANUFACTURING SEMICONDUCTOR INTEGRATED CIRCUIT DEVICE

(75) Inventor: Takuya Futase, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 12/714,491

(22) Filed: Feb. 27, 2010

(65) Prior Publication Data

US 2010/0227472 A1    Sep. 9, 2010

(30) Foreign Application Priority Data

Mar. 5, 2009    (JP) .................. 2009-051667

(51) Int. Cl.
*H01L 21/44* (2006.01)
(52) U.S. Cl. .. 438/655; 438/660; 438/653; 257/E21.584
(58) Field of Classification Search .................. 438/653, 438/655, 660; 257/E21.584
See application file for complete search history.

(56) References Cited

U.S. PATENT DOCUMENTS

| 6,831,012 B2 * | 12/2004 | Kang et al. ..................... 438/682 |
| 2007/0096221 A1 * | 5/2007 | Frohberg et al. ................ 257/383 |
| 2007/0161218 A1 | 7/2007 | Ichinose et al. |
| 2007/0238321 A1 | 10/2007 | Futase et al. |
| 2007/0257372 A1 | 11/2007 | Tada et al. |
| 2007/0269976 A1 | 11/2007 | Futase et al. |
| 2008/0176396 A1 | 7/2008 | Futase et al. |
| 2008/0311718 A1 | 12/2008 | Futase |

FOREIGN PATENT DOCUMENTS

| JP | 2001-102345 A | 4/2001 |
| JP | 2007-214538 A | 8/2007 |
| JP | 2007-281298 A | 10/2007 |
| JP | 2007-311540 A | 11/2007 |
| JP | 2008-103370 A | 5/2008 |
| JP | 2008-311457 A | 12/2008 |
| JP | 2009-088421 A | 4/2009 |
| WO | WO-2005/098913 A1 | 10/2005 |

OTHER PUBLICATIONS

U.S. Appl. No. 12/622,524.

\* cited by examiner

*Primary Examiner* — Alexander G Ghyka
*Assistant Examiner* — Seahvosh J Nikmanesh
(74) *Attorney, Agent, or Firm* — Miles & Stockbridge P.C.

(57) ABSTRACT

To solve a problem that it becomes difficult to lower contact resistance between nickel-based metal silicide and metal for contact as the result of the miniaturization of the hole. One invention of the present application is a method of manufacturing a semiconductor integrated circuit device having a MISFET subjected to silicidation of a source/drain region and the like by nickel-based metal silicide, the method performing a heat treatment for the upper surface of a silicide film in a non-plasma reducing vapor phase atmosphere containing a gas having a nitrogen-hydrogen bond as one of main gas components, before forming a barrier metal at a contact hole provided at a pre-metal insulating film.

20 Claims, 23 Drawing Sheets

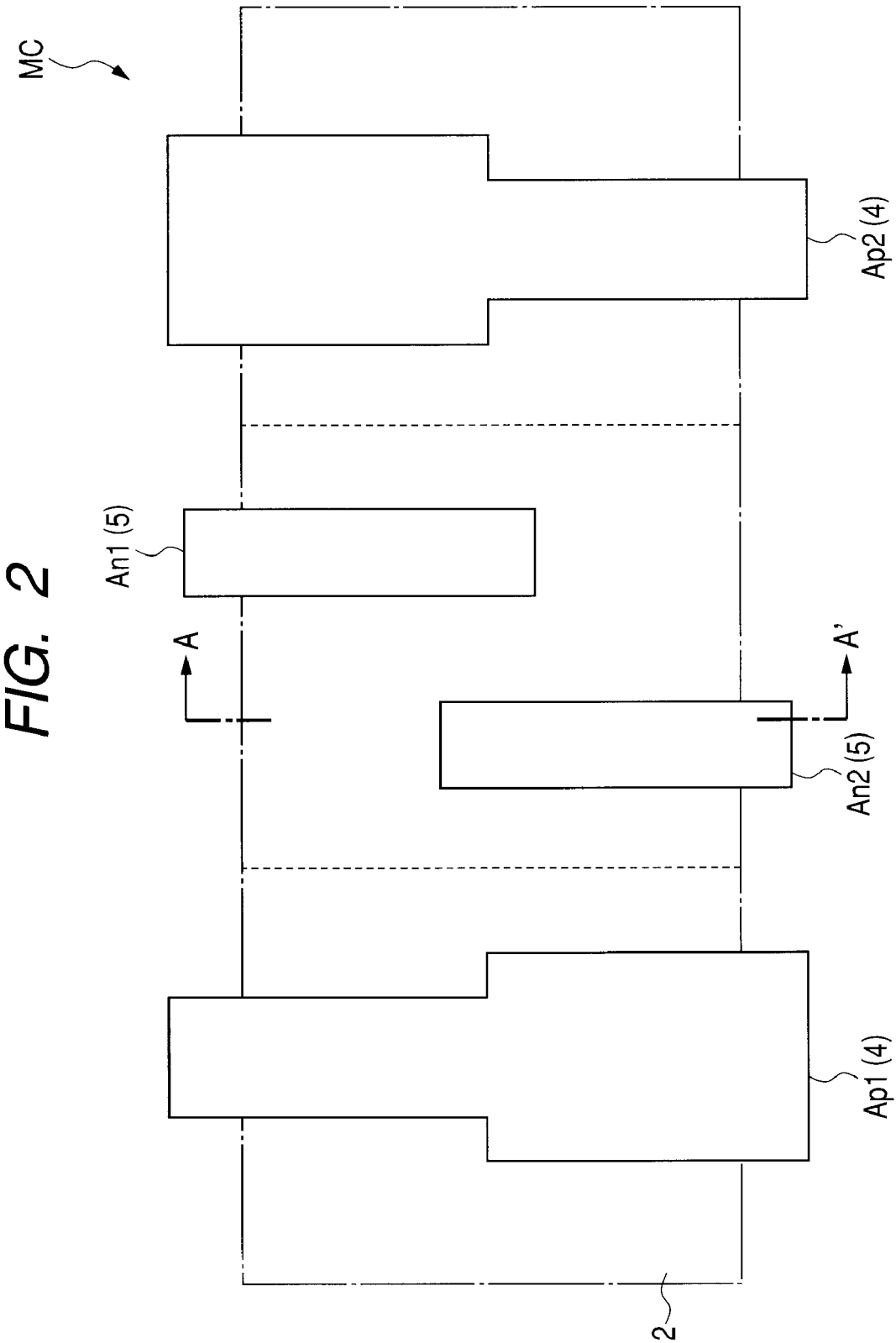

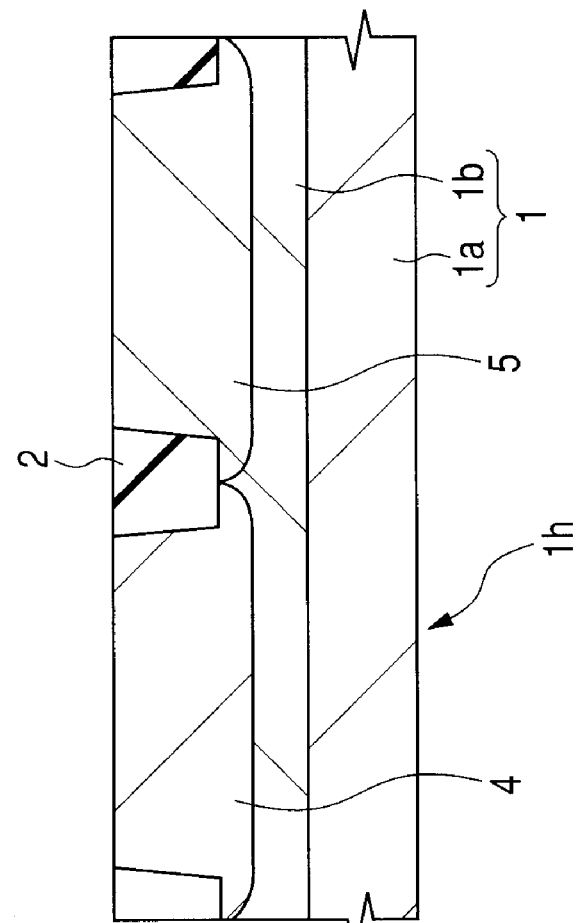
FIG. 3(a)
FIG. 3(b)

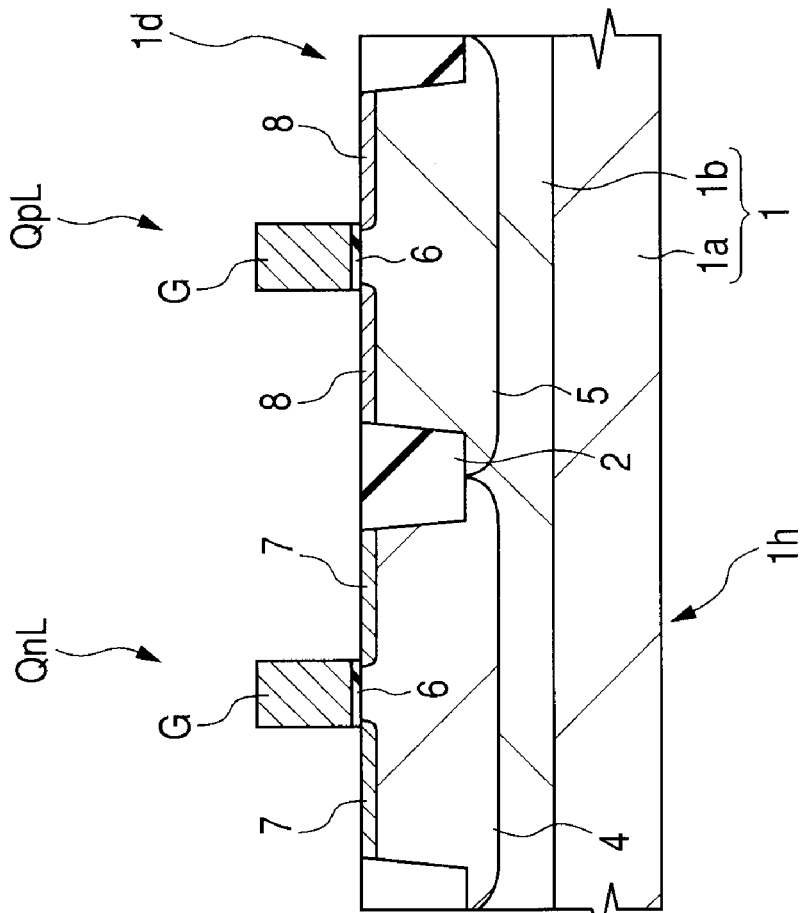
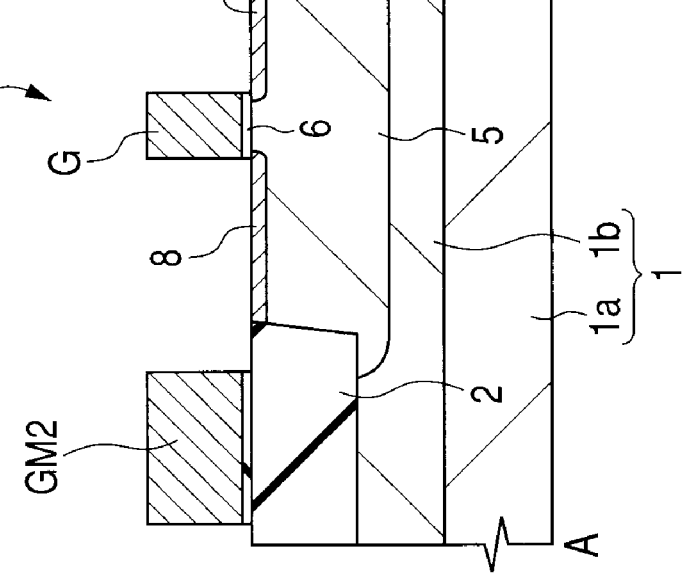
FIG. 5(a)
FIG. 5(b)

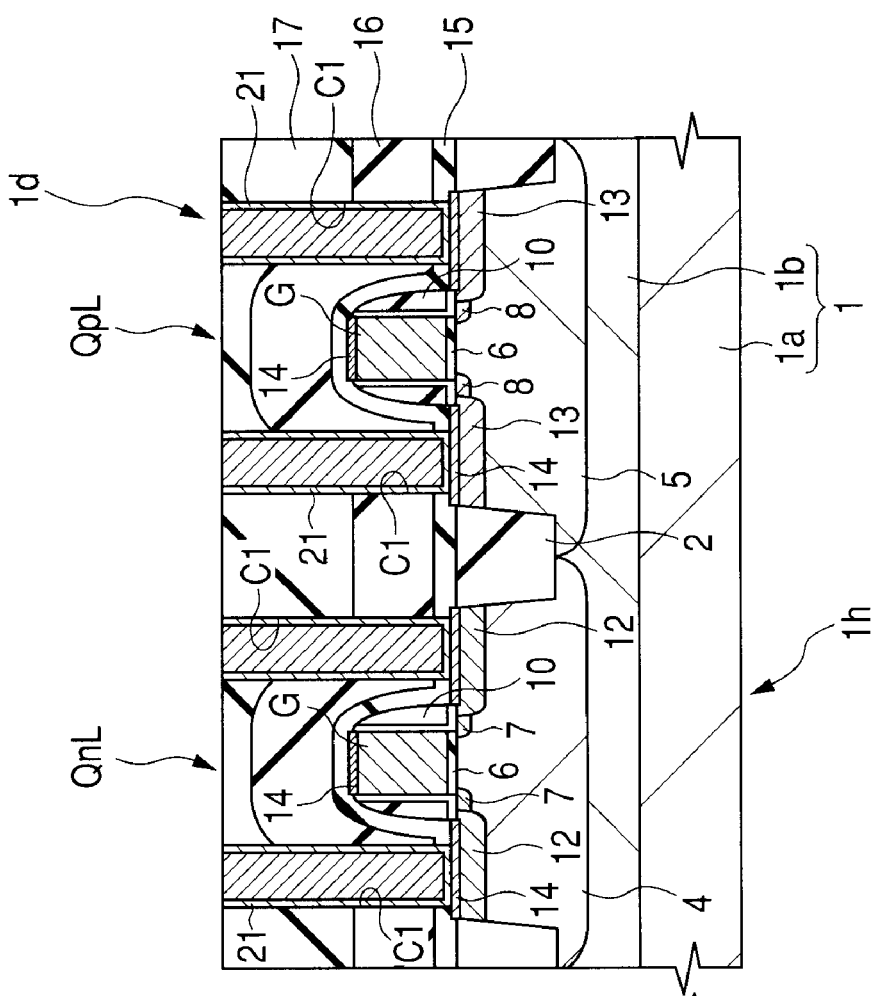
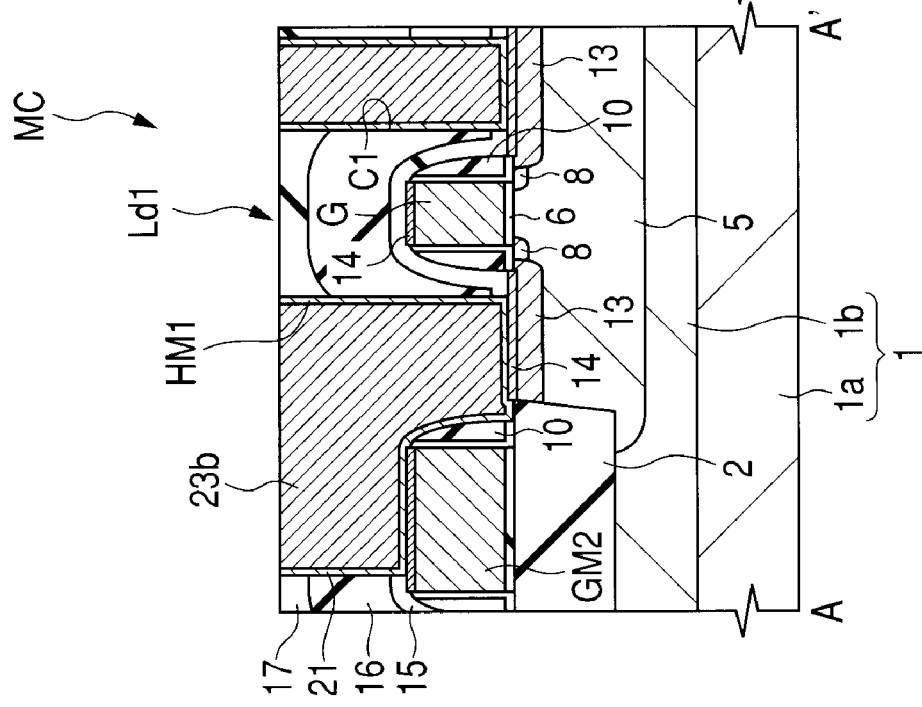

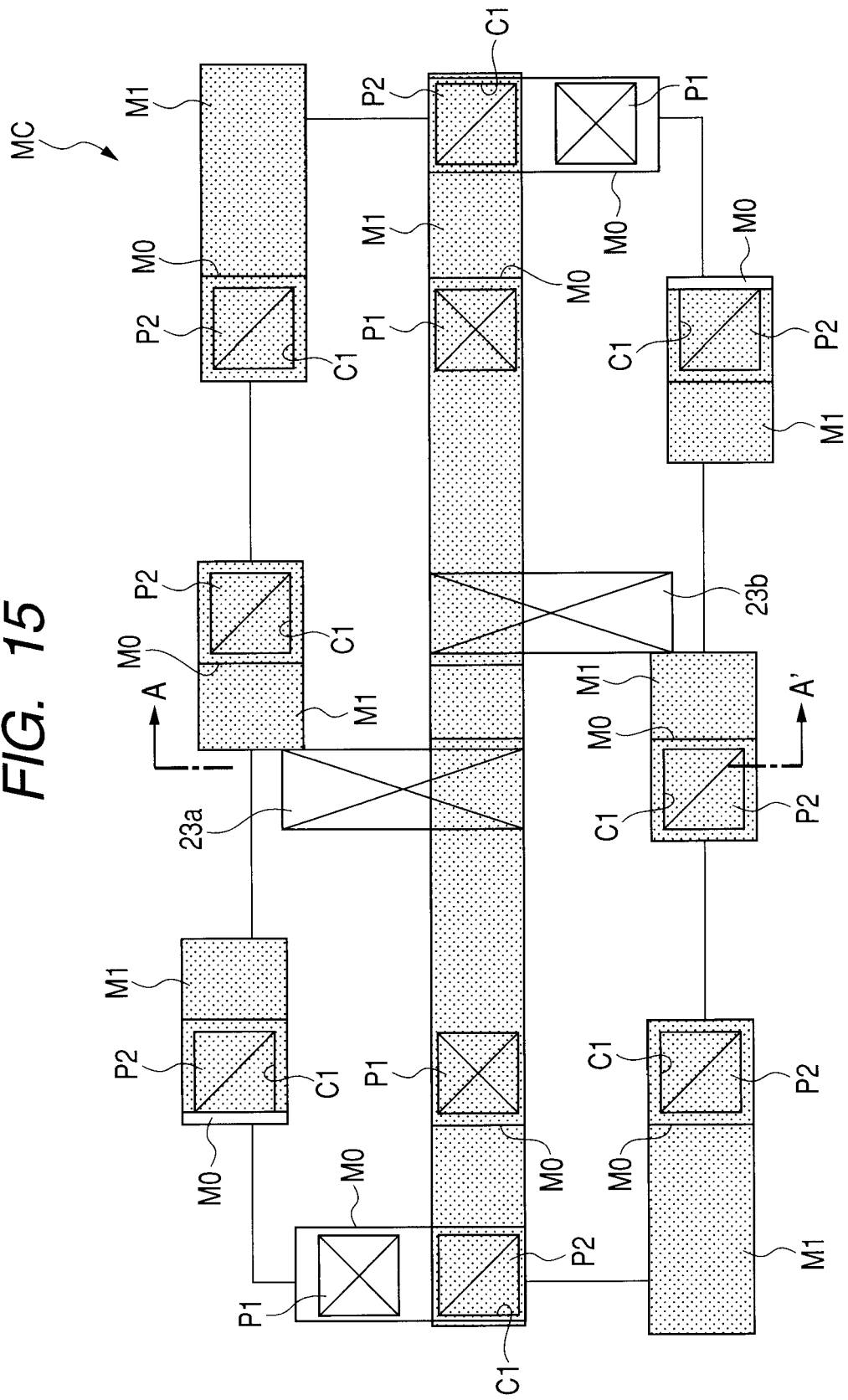

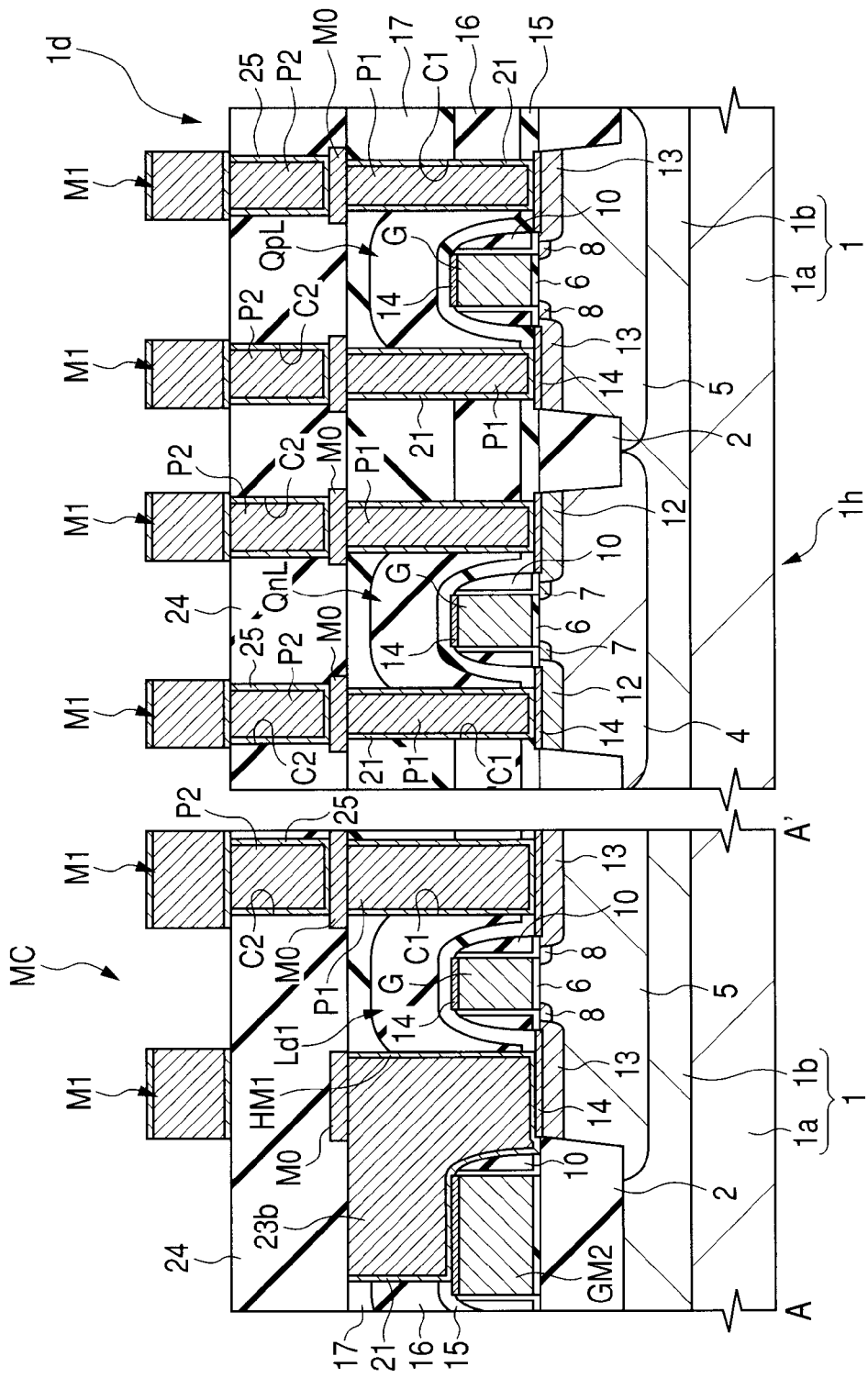

US 7,964,500 B2

METHOD OF MANUFACTURING SEMICONDUCTOR INTEGRATED CIRCUIT DEVICE

CROSS-REFERENCE TO RELATED APPLICATION

The disclosure of Japanese Patent Application No. 2009-51667 filed on Mar. 5, 2009 including the specification, drawings and abstract is incorporated herein by reference in its entirety.

BACKGROUND OF THE INVENTION

The present invention relates to a technology which is effective when applied to a contact forming technology in a method of manufacturing a semiconductor integrated circuit device (or semiconductor device).

Patent Document 1 (Japanese Unexamined Patent Publication No. 2001-102345) discloses a technology of easily generating ammonium fluoride by heating ammonia and nitrogen trifluoride and the like at around 700° C., regarding a technology of dry washing for removing a natural oxide film on the silicon surface by vapor phase ammonium fluoride.

Patent Document 2 (Japanese Unexamined Patent Publication No. 2007-214538) or Patent Document 3 (US Patent Application No. 2007-0161218) discloses a technology of removing a natural oxide film on nickel silicide by heating at around 100° C. to 300° C. under a plasma atmosphere of a mixed gas of $NF_3$ gas and a gas containing a hydrogen element such as ammonia before forming a barrier metal film of contact, for lowering contact resistance caused by the natural oxide film and the like on nickel silicide.

Patent Document 4 (International Patent Publication No. WO2005/098913) or Patent Document 5 (US Patent Application No. 2007-0257372) discloses a technology of performing a dry cleaning treatment under a plasma atmosphere of a mixed gas of ammonia gas and hydrogen fluoride gas before forming a barrier metal film of contact, for lowering contact resistance caused by a natural oxide film and the like on nickel silicide.

Patent Document 6 (Japanese Unexamined Patent Publication No. 2007-281298) or Patent Document 7 (US Patent Application No. 2007-0238321) discloses a technology of removing a natural oxide film of the silicon surface under a remote plasma atmosphere in a mixed gas of $NF_3$ gas and ammonia and the like before forming a nickel film, as a dry cleaning method before the formation of nickel silicide.

Patent Document 8 (Japanese Unexamined Patent Publication No. 2007-311540) or Patent Document 9 (US Patent Application No. 2007-0269976) discloses a technology of removing a natural oxide film on nickel silicide under a remote plasma atmosphere in a mixed gas of $NF_3$ gas and a gas containing a hydrogen element such as ammonia before forming a barrier metal film of contact, for lowering contact resistance caused by the natural oxide film and the like on nickel silicide.

Patent Document 10 (Japanese Unexamined Patent Publication No. 2008-311457), Patent Document 11 (US Patent Application No. 2008-0311718), Patent Document 12 (Japanese Unexamined Patent Publication No. 2008-103370), or Patent Document 13 (US Patent Application No. 2008-0176396) discloses a technology of removing a natural oxide film on nickel silicide by a plasma treatment in a mixed gas containing ammonia gas after forming a barrier metal film of contact, for lowering contact resistance caused by the natural oxide film and the like on nickel silicide.

SUMMARY OF THE INVENTION

For connecting a semiconductor substrate and wiring in a semiconductor device, a conductive member embedded inside a contact hole passing through an insulating film formed between them, for example, a plug made of tungsten or copper, is used. At the surface of the semiconductor substrate contacting the bottom portion of the contact hole, a silicide layer for enabling formation of low resistant and shallow joint is formed. Especially, since a nickel silicide (NiSi) layer has low resistance of 14 to 20 μO·cm and can be formed by a salicide technology at a comparatively low temperature of, for example, 400 to 600° C., in these years, a nickel silicide layer (more generally, nickel-based metal silicide) has generally been adopted for semiconductor elements for which miniaturization is required.

Incidentally, between the plug embedded inside the contact hole and the nickel silicide layer formed at the surface of the semiconductor substrate, generally, a barrier metal film having a laminated structure of stacking a titanium nitride film on a titanium film is formed. The titanium film is used as a reducing material for the surface of the nickel silicide layer because it can achieve solid solution with an oxygen atom up to 12 at %, and has a function of lowering the contact resistance with the nickel silicide layer. The titanium nitride film also has a function of suppressing or preventing the diffusion of a constituent atom of the plug.

For the barrier metal film having a laminated structure of stacking a titanium nitride film on a titanium film, however, there exist various technical problems as described below.

Generally, a titanium film is formed by a PECVD (Plasma Enhanced Chemical Vapor Deposition) method or a CVD method using $TiCl_4$ gas and $H_2$ gas, and a titanium nitride film is formed by a CVD method using $TiCl_4$ gas and $NH_3$ gas and the like, wherein it is necessary to set the temperature of the film-forming to 550° C. or less in consideration of heat resisting properties of the nickel silicide layer. However, when forming the titanium film and the titanium nitride film at a low temperature of 550° C. or less, there is such a problem that chlorine being a raw material gas remains in these barrier metal films having the laminated structure to increase the resistance of the barrier metal film and, as the result, to increase the contact resistance between the plug and the nickel silicide layer. Further, there are such problems as the occurrence of separation between the titanium film and the titanium nitride film caused by the chlorine remaining in the barrier metal film, or the occurrence of micro cracks in the titanium nitride film when the chlorine remaining in the barrier metal film is released into the air.

When a tungsten film to be the plug is embedded inside the contact hole, the tungsten film will be deposited on the titanium nitride film constituting the upper portion of the barrier metal film. The tungsten film is formed by a CVD method utilizing the reduction of $WF_6$ gas by $H_2$ gas. On this occasion, fluorine contained in the $WF_6$ gas sometimes penetrates up to the titanium film via grain boundaries of the titanium nitride film to cause swelling or peeling of the titanium film. Since the titanium nitride film is formed between the titanium film and the tungsten film, the penetration of the fluorine may be prevented by increasing the thickness thereof. The increase in the thickness of the titanium nitride film, however, increases the resistance of the barrier metal film, and, therefore, the thickness needs to be small such as 10 nm or less, which makes it difficult to prevent the penetration of the fluorine contained in the $WF_6$ gas.

Further, a natural oxide film (oxidized silicon film) is sometimes generated on the surface of the nickel silicide layer to generate a place that is electrically nonconductive between the titanium film constituting the lower portion of the barrier metal film and the nickel silicide layer. The present inventor confirmed that the place that tends to become electrically nonconductive easily occurs, in a first and second field effect transistors, for example, that have a gate electrode made of a polycrystalline silicon film and a nickel silicide layer formed on the surface thereof and are formed adjacently, in a shared contact formed by sharing a contact hole formed in contact with the gate electrode of the first field effect transistor and a contact hole formed in contact with the drain (or source) of the second field effect transistor, and that the place frequently occurs when the edge portion of the nickel silicide layer or the polycrystalline silicon film constituting the gate electrode of the first field effect transistor is exposed by over etching.

Further, it becomes clear that the oxide film of the nickel silicide layer upper surface sometimes can not sufficiently be removed by a reducing treatment performed after forming the titanium film constituting the lower portion of the barrier metal film.

Furthermore, when a plug made of copper is employed as a conductive member to be embedded inside the contact hole, firstly a seed layer made of copper or ruthenium is formed inside the contact hole, then a copper film is formed on the seed layer using an electrolytic plating method, and thereby the copper film is embedded inside the contact hole. However, the seed layer is not uniformly formed when contamination or the like exists on the surface of the barrier metal film, and, accordingly, sometimes the copper film cannot completely be embedded into the contact hole, which generates conduction failure of the plug.

The invention of present application was achieved to solve such problems.

An object of the present invention is to provide a manufacturing process of semiconductor integrated circuit devices with high reliability.

The above and other purposes and novel features of the present invention will become clear from the description of the present specification and the accompanying drawings.

The following explains briefly the outline of typical inventions among the inventions disclosed in the present application.

That is, one invention of the present application is a method of manufacturing a semiconductor integrated circuit device having a MISFET subjected to silicidation of a source/drain region and the like by nickel-based metal silicide, the method performing a heat treatment for the upper surface of a silicide film in a non-plasma reducing vapor phase atmosphere containing a gas having a nitrogen-hydrogen bond as one of main gas components, before forming a barrier metal at a contact hole provided at a pre-metal insulating film.

The following explains briefly the effect acquired by the typical invention among the inventions disclosed in the application.

That is, in the method of manufacturing a semiconductor integrated circuit device having a MISFET subjected to silicidation of a source/drain region and the like by nickel-based metal silicide, by performing a heat treatment for the upper surface of the silicide film in non-plasma reducing vapor phase atmosphere containing a gas having a nitrogen-hydrogen bond as one of main gas components before forming a barrier metal at the contact hole provided at the pre-metal insulating film, the natural oxide film of the upper surface of the silicide film can be removed effectively.

BRIEF DESCRIPTION OF THE DRAWINGS

FIG. 2 is a plan view of an essential part of a semiconductor substrate showing a method of manufacturing an SRAM according to one embodiment of the invention;

FIGS. 3(a) and 3(b) are cross-sectional views of the essential part of a semiconductor substrate showing a method of manufacturing an SRAM according to one embodiment of the present invention. FIG. 3(a) shows a part of a memory cell region (A-A' line in FIG. 2), and FIG. 3(b) shows a part of a peripheral circuit region;

FIGS. 5(a) and 5(b) are cross-sectional views of the essential part of the same place as that in FIGS. 3(a) and 3(b) in a manufacturing process subsequent to FIGS. 2, 3(a) and 3(b);

FIGS. 14(a) and 14(b) are cross-sectional views of the essential part of the same place as that in FIGS. 3(a) and 3(b) in a manufacturing process subsequent to FIG. 13;

FIG. 15 is a plan view of the essential part of the same place as that in FIG. 2 in a manufacturing process subsequent to FIGS. 14(a) and 14(b);

FIGS. 16(a) and 16(b) are cross-sectional views of the essential part of the same place as that in FIGS. 3(a) and 3(b) in a manufacturing process subsequent to FIGS. 14(a) and 14(b);

DETAILED DESCRIPTION OF THE PREFERRED EMBODIMENTS

Outline of Embodiment

Figure 1:
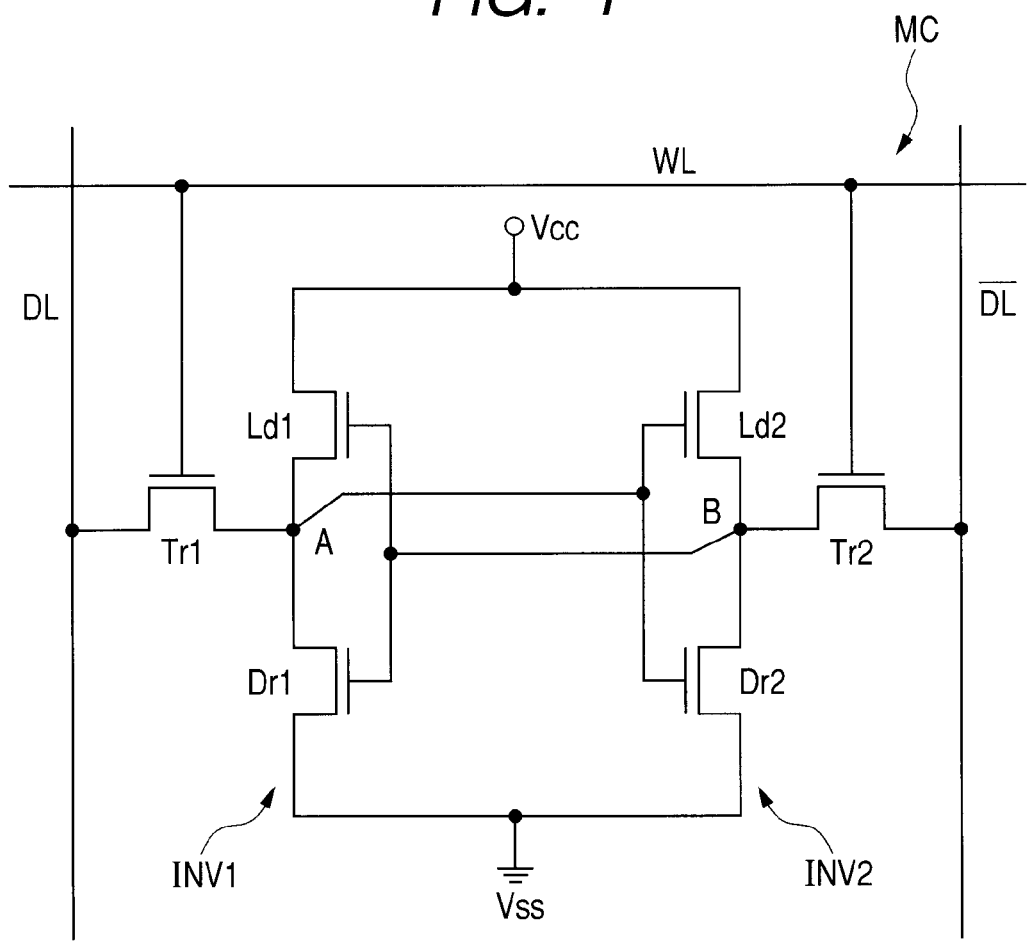
FIG. 1 is an equivalent circuit diagram showing a memory cell of an SRAM according to one embodiment of the present invention.

Firstly, the outline of typical embodiments of the invention disclosed in the present application will be described briefly.

1. A method of manufacturing a semiconductor integrated circuit device including the steps of: (a) forming a pre-metal insulating film on a device surface of a semiconductor wafer via an etch stop insulating film; (b) opening a contact hole passing through the pre-metal insulating film and the etch stop insulating film; (c) performing a heat treatment for the upper surface of a nickel-based metal silicide film at the bottom of the contact hole in a first non-plasma reducing vapor phase atmosphere containing a gas having a nitrogen-hydrogen bond as one of main gas components; (d) after the step (c), forming a titanium-based barrier metal film at the upper surface of the pre-metal insulating film and the inner surface of the contact hole; (e) forming a plug metal layer to the upper surface of the pre-metal insulating film and the titanium-based barrier metal film of the inner surface of the contact hole; and (f) removing the titanium-based barrier metal film and the plug metal layer outside the contact hole.

2. In the method of manufacturing a semiconductor integrated circuit device according to the item 1, the gas having a nitrogen-hydrogen bond is ammonia gas.

3. In the method of manufacturing a semiconductor integrated circuit device according to the item 1, the gas having a nitrogen-hydrogen bond is hydrazine gas.

4. In the method of manufacturing a semiconductor integrated circuit device according to any one of items 1 to 3, the first non-plasma reducing vapor phase atmosphere contains hydrogen gas as one of main components.

5. In the method of manufacturing a semiconductor integrated circuit device according to any one of items 1 to 3, the first non-plasma reducing vapor phase atmosphere contains hydrogen gas as the most plentiful component.

6. In the method of manufacturing a semiconductor integrated circuit device according to any one of items 1 to 5, the first non-plasma reducing vapor phase atmosphere contains an inert gas as one of main components.

7. In the method of manufacturing a semiconductor integrated circuit device according to any one of items 1 to 5, the first non-plasma reducing vapor phase atmosphere contains argon gas as one of main components.

8. In the method of manufacturing a semiconductor integrated circuit device according to any one of items 1 to 7, the first non-plasma reducing vapor phase atmosphere substantially does not contain any of oxygen gas, halogen gas, and organic gas.

9. In the method of manufacturing a semiconductor integrated circuit device according to any one of items 1 to 8, the plug metal layer includes a tungsten-based metal layer as a main constituent.

10. In the method of manufacturing a semiconductor integrated circuit device according to any one of items 1 to 9, the step (d) includes the substeps of: (d1) after the step (c), forming a titanium-based metal film at the upper surface of the pre-metal insulating film and the inner surface of the contact hole; and (d2) forming a titanium nitride film at the upper surface of the titanium-based metal film by performing a plasma nitridation treatment for the upper surface of the titanium-based metal film.

11. In the method of manufacturing a semiconductor integrated circuit device according to the item 10, the step (c) and the substep (d1) are performed over a first wafer stage in a first CVD treatment chamber.

12. In the method of manufacturing a semiconductor integrated circuit device according to the item 10 or 11, the step (c) and the substep (d2) are performed over the first wafer stage in the first CVD treatment chamber.

13. In the method of manufacturing a semiconductor integrated circuit device according to any one of items 10 to 12, the step (d) further includes the substep of (d3) after the substep (d1) and before the substep (d2), performing a heat treatment for the upper surface of the nickel-based metal silicide film via the titanium-based metal film in a second non-plasma reducing vapor phase atmosphere containing a gas having a nitrogen-hydrogen bond as one of main gas components.

14. In the method of manufacturing a semiconductor integrated circuit device according to the item 13, the step (c) and the substep (d3) are performed over the first wafer stage in the first CVD treatment chamber.

15. In the method of manufacturing a semiconductor integrated circuit device according to any one of items 10 to 14, the step (d) further includes the substep of (d4) after the substep (d1) and before the substep (d3), performing a vapor phase plasma treatment with hydrogen gas as a main component for the device surface side of the semiconductor wafer.

16. In the method of manufacturing a semiconductor integrated circuit device according to the item 15, the step (c) and the substep (d4) are performed over the first wafer stage in the first CVD treatment chamber.

17. In the method of manufacturing a semiconductor integrated circuit device according to any one of items 1 to 16, a contact structure formed in the contact hole is a shared contact.

18. In the method of manufacturing a semiconductor integrated circuit device according to any one of items 10 to 17, the substep (d1) is performed by a plasma CVD method.

19. In the method of manufacturing a semiconductor integrated circuit device according to any one of items 10 to 18, the step (d) further includes the substep of (d5) after the step (c) and before the substep (d1), performing a treatment approximately the same as that in the substep (d1) in a state of applying no plasma.

20. In the method of manufacturing a semiconductor integrated circuit device according to the item 19, the step (c) and the substep (d5) are performed over the first wafer stage in the first CVD treatment chamber.

21. In the method of manufacturing a semiconductor integrated circuit device according to any one of items 13 to 20, the gas having a nitrogen-hydrogen bond in the substep (d3) is ammonia gas.

22. In the method of manufacturing a semiconductor integrated circuit device according to any one of items 13 to 20, the gas having a nitrogen-hydrogen bond in the substep (d3) is hydrazine gas.

23. In the method of manufacturing a semiconductor integrated circuit device according to any one of items 13 to 22, the second non-plasma reducing vapor phase atmosphere contains hydrogen gas as one of main components.

24. In the method of manufacturing a semiconductor integrated circuit device according to any one of items 13 to 22, the second non-plasma reducing vapor phase atmosphere contains hydrogen gas as the most plentiful component.

25. In the method of manufacturing a semiconductor integrated circuit device according to any one of items 13 to 24, the second non-plasma reducing vapor phase atmosphere contains an inert gas as one of main components.

26. In the method of manufacturing a semiconductor integrated circuit device according to any one of items 13 to 25, the second non-plasma reducing vapor phase atmosphere contains argon gas as one of main components.

27. In the method of manufacturing a semiconductor integrated circuit device according to any one of items 13 to 26, the second non-plasma reducing vapor phase atmosphere substantially does not contain any of oxygen gas, halogen gas and organic gas.

28. In the method of manufacturing a semiconductor integrated circuit device according to any one of items 10 to 27, the step (d) further includes the substep of (d5) after the substep (d2), performing a heat treatment for the upper surface of the nickel-based metal silicide film via the titanium-based metal film and the titanium nitride film in a third non-plasma reducing vapor phase atmosphere containing a gas having a nitrogen-hydrogen bond as one of main gas components.

29. In the method of manufacturing a semiconductor integrated circuit device according to the item 28, the step (c) and the substep (d5) are performed over the first wafer stage in the first CVD treatment chamber.

Explanation of Description Forms, Basic Terms, and Usage in the Application

1. In the application, the description of an embodiment will be occasionally described, divided into plural sections, if necessary for convenience. Except for the case where it shows clearly in particular, they are not independent from each other, and they are respective parts of a single example, one is a detailed part of the other or a modified example of a part or the whole, and the like. As a general rule, the repetition of the same parts is omitted. Further, respective constitutional elements in an embodiment are not indispensable, excluding such cases where the contrary is clearly expressed in particular, a number is theoretically limited to the number, and the contrary is clear from the context.

Further, in the application, a "semiconductor integrated circuit device" means, mainly, a product integrating a resistance, a capacitor and the like on a semiconductor chip or the like (for example, a single crystal silicon substrate) with various transistors (active element) as the center. Here, as representative transistors of various types, a MISFET (Metal Insulator Semiconductor Field Effect Transistor) represented by a MOSFET (Metal Oxide Semiconductor Field Effect Transistor) can be exemplified. On this occasion, as a representative integrated circuit configuration, a CMIS (Complementary Metal Insulator Semiconductor) type integrated circuit represented by CMOS (Complementary Metal Oxide Semiconductor) type integrated circuit combining an N-channel type MISFET and a P-channel type MISFET can be exemplified. Note that an expedient description of MOSFET does not exclude non-oxide films.

Today's wafer process of semiconductor integrated circuit devices, that is, LSI (Large Scale Integration) can broadly be divided, usually, to an FEOL (Front End of Line) process from transfer-in of a silicon wafer as the raw material to around premetal process (process constituted of formation of an interlayer insulating film and the like between an M1 wiring layer lower edge and a gate electrode structure, formation of a contact hole, tungsten plug embedding, and the like), and a BEOL (Back End of Line) process starting from the formation of an M1 wiring layer to around the formation of a pad opening to a final passivation film on an aluminum-based pad electrode (in a wafer level package process, the process is also included). In the FEOL process, a gate electrode patterning process, a contact hole formation process and the like are fine processing processes that require particularly fine processing. On the other hand, in the BEOL process, fine processing is required, in particular, for a via and trench formation process, in particular, in relatively lower layer local wiring (for example, in the case of embedded wiring having a structure of around 4 layers, from M1 to around M3, and in the case of fine embedded wiring having a structure of around 10 layers, from M1 to around M5). Meanwhile, "MN (usually N=1 to around 15)" represents Nth layer wiring from the bottom. M1 is a first layer wiring, and M3 is a third layer wiring. Meanwhile, for some products, occasionally, a subtractive wiring (non-damascene wiring) referred to as "M0 wiring" or the like, which includes a tungsten-based member or the like as a main constituent, is inserted for local wiring between premetal regions of M1. Primary embodiments of the application correspond to the example.

2. Similarly, in the description of the embodiment and the like, for materials, compositions and the like, the expression "X made of A" does not exclude those including an element other than A as one of main constituents, excluding such cases where the contrary is clearly expressed in particular, and the contrary is clear from the context. For example, in the case of a component, it means "X including A as a main component" and the like. For example, a "silicon member" or the like is not limited to pure silicon, but, needless to say, also includes SiGe, SiGeC alloy, and, in addition, multi-component alloys including silicon (including strained silicon member) as a main component, and members including another additive or the like. Further, the expression of polycrystalline silicon and the like includes, needless to say, not only typical one, but also amorphous silicon and the like, excluding such cases where the contrary is clear, and the contrary is clearly shown.

Similarly, the expression of a "silicon oxide film" or "silicon oxide-based insulating film" means, needless to say, not only relatively pure undoped silicon dioxide, but also FSG (Fluorosilicate Glass), TEOS-based silicon oxide, SiOC (Silicon Oxicarbide), or Carbon-doped Silicon oxide, or thermally-oxidized films such as OSG (Organosilicate glass), PSG (Phosphorus Silicate Glass) or BPSG (Borophosphosilicate Glass), CVD oxidized films, coating-based silicon oxide such as SOG (Spin ON Glass) or nano-clustering silica (NSC), a silica-based low-k insulating film formed by introducing vacancy to a member similar to these (a porous insulating film), and complex films having these as a main constituent with another silicon-insulating film, and the like.

Further, as silicon-based insulating films that are commonly used in the semiconductor field along with the silicon oxide-based insulating film, there is a silicon nitride-based insulating film. Materials belonging to the line include SiN, SiCN, SiNH, SiCNH, and the like. Here, the expression "silicon nitride" includes both SiN and SiNH, excluding the case where the contrary is clearly expressed in particular. Similarly, the expression "SiCN" includes both SiCN and SiCNH, excluding the case where the contrary is clearly expressed in particular.

Meanwhile, SiC has properties similar to those of SiN, but, frequently, SiON should be classified rather to a silicon oxide-based insulating film.

The silicon nitride film is frequently used as an etch stop film in the SAC (Self-Aligned Contact) technology, and, in addition, is also used as a stress imparting film in SMT (Stress Memorization Technique).

Similarly, the expression "nickel silicide" means, usually, nickel monosilicide, but it includes not only comparatively pure nickel monosilicide, but also alloys, mixed crystals and the like which include nickel monosilicide as a main constituent. Further, the silicide is not limited to nickel silicide, but it may be cobalt silicide, titanium silicide, tungsten silicide and the like that have shown good results from the past. Further, as a metal film for silicidation, in addition to a Ni (nickel) film, there may be used, for example, nickel alloy films such as a Ni—Pt alloy film (an alloy film of Ni and Pt), a Ni—V alloy film (an alloy film of Ni and V), a Ni—Pd alloy film (an alloy film of Ni and Pd), a Ni—Yb alloy film (an alloy film of Ni and Yb) or a Ni—Er alloy film (an alloy film of Ni and Er). Note that these silicides including nickel as a main metal element are collectively referred to as "nickel-based metal silicide".

3. Similarly, for figures, positions, attributes, and the like, favorable examples are shown, but, needless to say, they are not strictly limited to these, excluding the case where the contrary is clearly expressed in particular, and the contrary is clear from the context.

4. Further, when a specified numerical value or numerical quantity is referred to, a value exceeding the specified value or a value less than the specified value is allowable, excluding the case where the contrary is clearly expressed in particular, the number is theoretically limited to the value, and the contrary is clear from the context.

5. The expression a "wafer" usually denotes a single crystalline silicon wafer over which a semiconductor integrated circuit device (semiconductor device and electronic device mean the same) is to be formed, but, needless to say, it also includes complex wafers of an insulating substrate such as epitaxial wafers, SOI substrates, or LCD glass substrates and a semiconductor layer and the like.

Details of Embodiments

Embodiments will be described in more detail. In respective drawings, the same or similar parts are denoted by the same or similar symbols or reference numbers, and the description is not repeated as a general rule.

In the accompanying drawings, in such a case that hatching or the like makes the situation totally complex, or the difference from the void is clear, occasionally it is omitted even for a cross-sectional view. In this context, when the case is clear from the description or the like, occasionally a profile line in the background is omitted even for a hole closed in a planar state. Further, hatching may be applied even when it is not a cross-section, to clearly show that it is not a void.

Meanwhile, details of plasma treatment and the like that are performed for the upper surface of a nickel-based metal silicide film before a CVD (Chemical Vapor Deposition) treatment of a silicon nitride film for SAC (Self-Aligned Contact) in a reducing atmosphere such as an ammonia atmosphere are described in Japanese Patent Application No. 2007-259355 (Japanese Application Date: Oct. 3, 2007) according to inventors of the present application, and, therefore, the application does not repeat the description of these parts, as a general rule.

Further, details of non-bias plasma treatment and the like that are performed for the upper surface of a nickel-based metal silicide film before a CVD treatment of a silicon nitride film for SAC in an inert gas atmosphere are described in Japanese Patent Application No. 2008-300439 (Japanese Application Date: Nov. 26, 2008) according to inventors of the present application, and, therefore, the application does not repeat the description of these parts, as a general rule.

1. Explanation of a front end portion of a wafer process in the method of manufacturing a semiconductor integrated circuit device of one embodiment of the application, and a CMIS SRAM being an example of a target device, and the like (mainly FIGS. 1 to 8). In the present embodiment, the invention achieved by the present inventor will be described about the case where the invention is applied to a memory cell of an SRAM (Static Random Access Memory), which is an application field constituting the background of the invention.

FIG. 1 is an equivalent circuit diagram that shows a memory cell of SRAM according to an embodiment of the present invention.

As shown in the drawing, a memory cell MC is disposed at the cross portion of a pair of complementary data lines (data line DL, data line /DL) and a word line WL, and is constituted of a pair of MISFETs for drive (Dr1, Dr2), a pair of MISFETs for load (Ld1, Ld2) and a pair of MISFETs for transfer (Tr1, Tr2). MISFETs for drive (Dr1, Dr2) and MISFETs for transfer (Tr1, Tr2) are constituted of nMISFETs, and MISFETs for load (Ld1, Ld2) are constituted of pMISFETs.

Among the six MISFETs constituting the memory cell MC, the MISFET for drive (Dr1) and the MISFET for load (Ld1) constitute a CMOS inverter INV1, and the MISFET for drive (Dr2) and MISFET for load (Ld2) constitute a CMOS inverter INV2. Mutual input-output terminals (memory nodes A, B) of these pair of CMOS inverters INV1 and INV2 are cross-linked, constituting a flip-flop circuit as an information accumulation portion that memorizes information of one bit. Further, one input-output terminal (memory node A) of the flip-flop circuit is coupled to one of the source and drain of the MISFET for transfer (Tr1), and the other input-output terminal (memory node B) is coupled to one of the source and drain of the MISFET for transfer (Tr2).

Further, the other of the source and drain of the MISFET for transfer (Tr1) is coupled to the data line DL, and the other of the source and drain of the MISFET for transfer (Tr2) is coupled to the data line /DL. Further, one end of the flip-flop circuit (respective sources of MISFETs for load (Ld1, Ld2)) is coupled to power supply voltage (Vcc), and the other end (respective sources of MISFETs for drive (Dr1, Dr2)) is coupled to reference voltage (Vss).

The operation of the above circuit will be described. When the memory node A of one CMOS inverter INV1 is at a high electric potential ("H"), since the MISFET for drive (Dr2) is turned ON, the memory node B of the other CMOS inverter INV2 is at a low electric potential ("L"). Accordingly, the MISFET for drive (Dr1) is turned OFF to hold the high electric potential ("H") of the memory node A. That is, mutual states of memory nodes A and B are held by a latch circuitry formed by cross-linking a pair of CMOS inverters INV1 and INV2, and information is retained during the application of the power supply voltage.

To respective gate electrodes of MISFETs for transfer (Tr1, Tr2), the word line WL is coupled, and the word line WL controls a conduction state and non-conduction state of MISFETs for transfer (Tr1, Tr2). That is, when the word line WL is at a high electric potential ("H"), MISFETs for transfer (Tr1, Tr2) are turned ON to electrically couple the flip-flop circuit and complementary data lines (the data line DL, /DL), and, therefore, the electric potential state ("H" or "L") of memory nodes A and B appears on the data lines DL and /DL, which is read out as the information of the memory cell MC.

In order to write information in the memory cell MC, the word line WL is set to a "H" electric potential level and MISFETs for transfer (Tr1, Tr2) are set to an ON state to transfer the information on the data lines DL and /DL to the memory nodes A and B.

Figure 10:
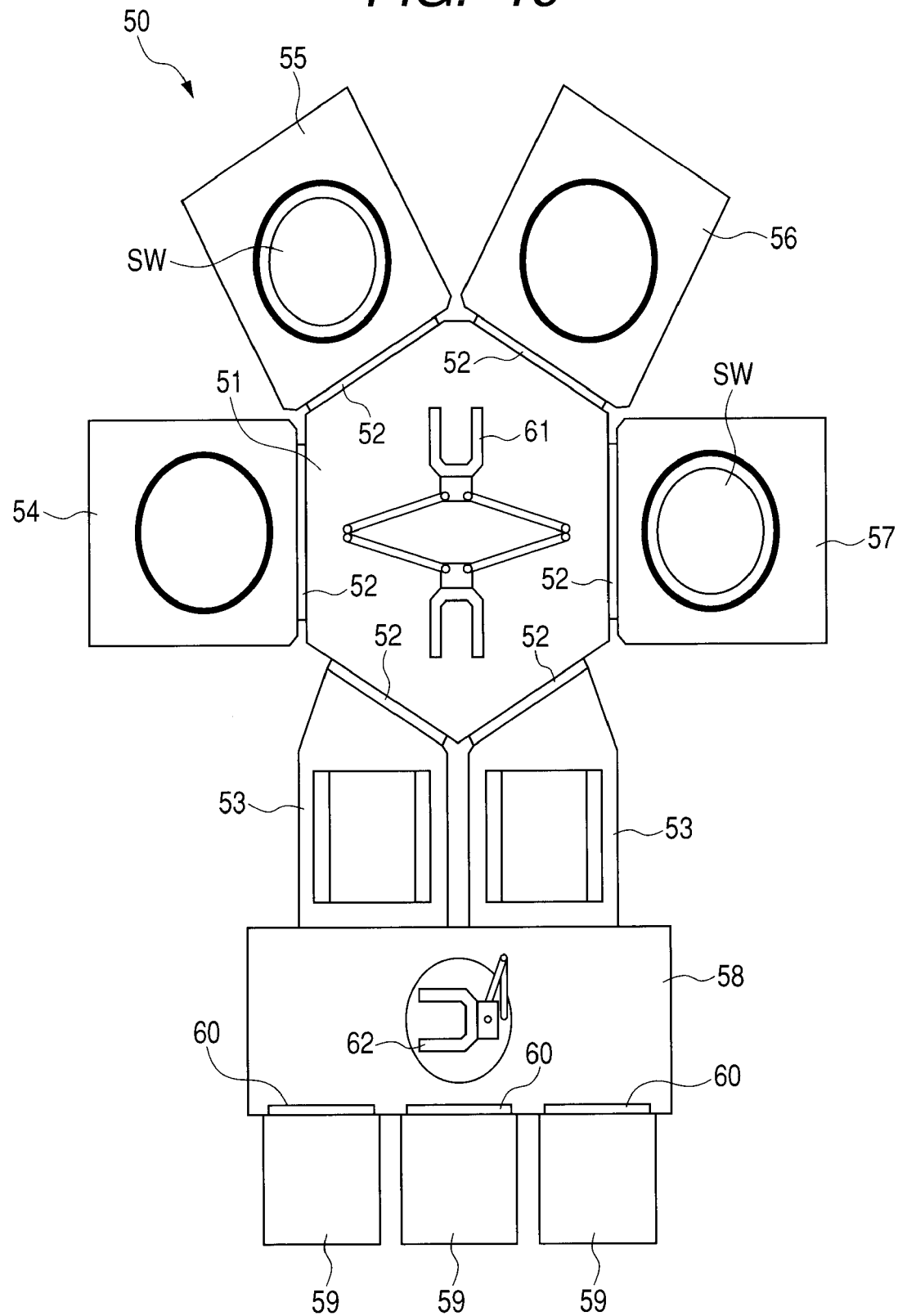
FIG. 10 is a schematic plan view of an integrated (multi-chamber type) film-forming apparatus (apparatus for forming a film and performing various kinds of vapor phase treatment) for use in forming a barrier metal film in a method of manufacturing a semiconductor integrated circuit device according to one embodiment of the invention.
Figure 11:
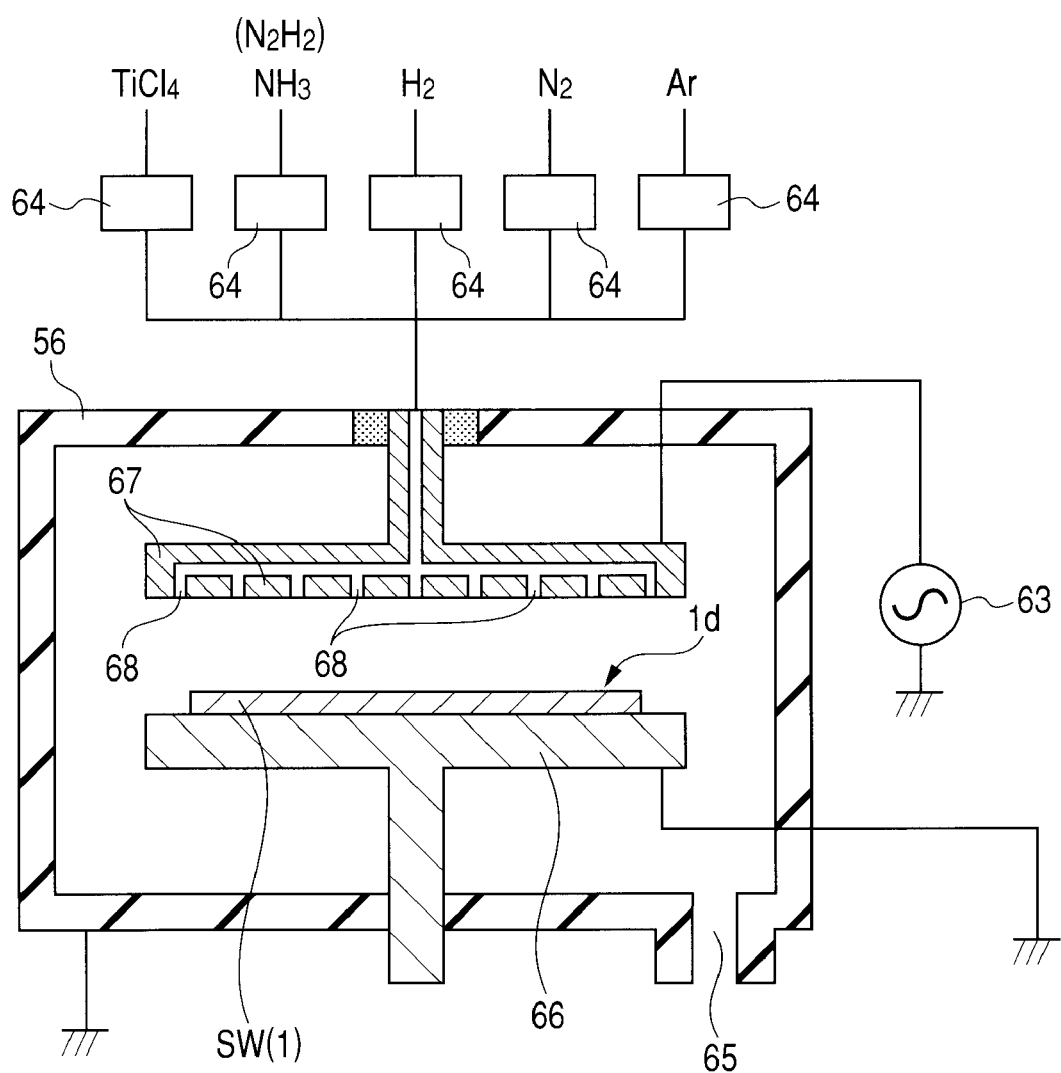
FIG. 11 is a cross-sectional view of an apparatus schematically illustrating the outline of the structure of a film forming chamber (CVD chamber) of the barrier metal film in FIG. 10.
Figure 12:
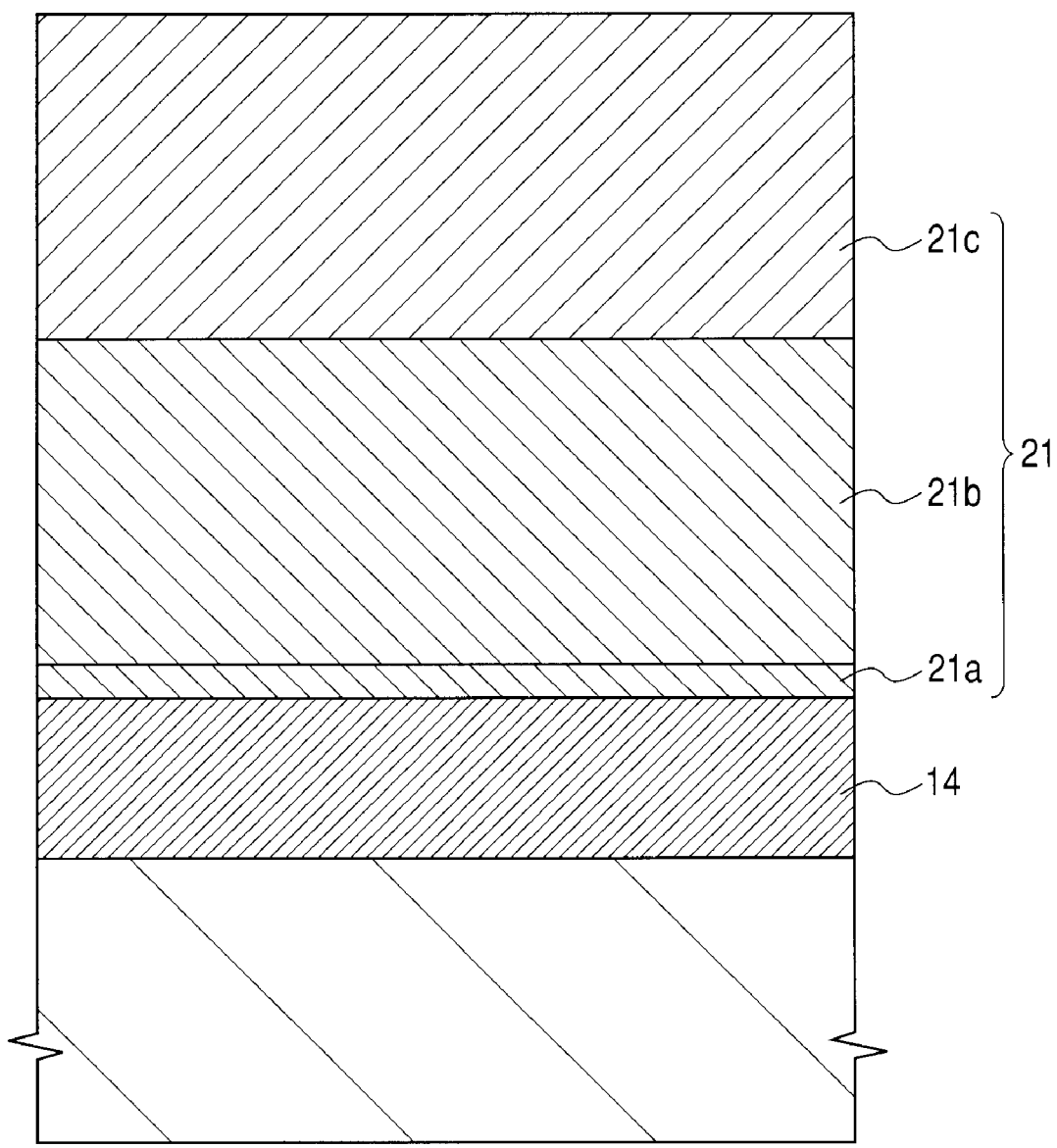
FIG. 12 is an enlarged cross-sectional view of the essential part showing the barrier metal film and the plug inside the contact hole in an SRAM manufacturing process subsequent to FIGS. 9(a) and 9(b)
Figure 13:
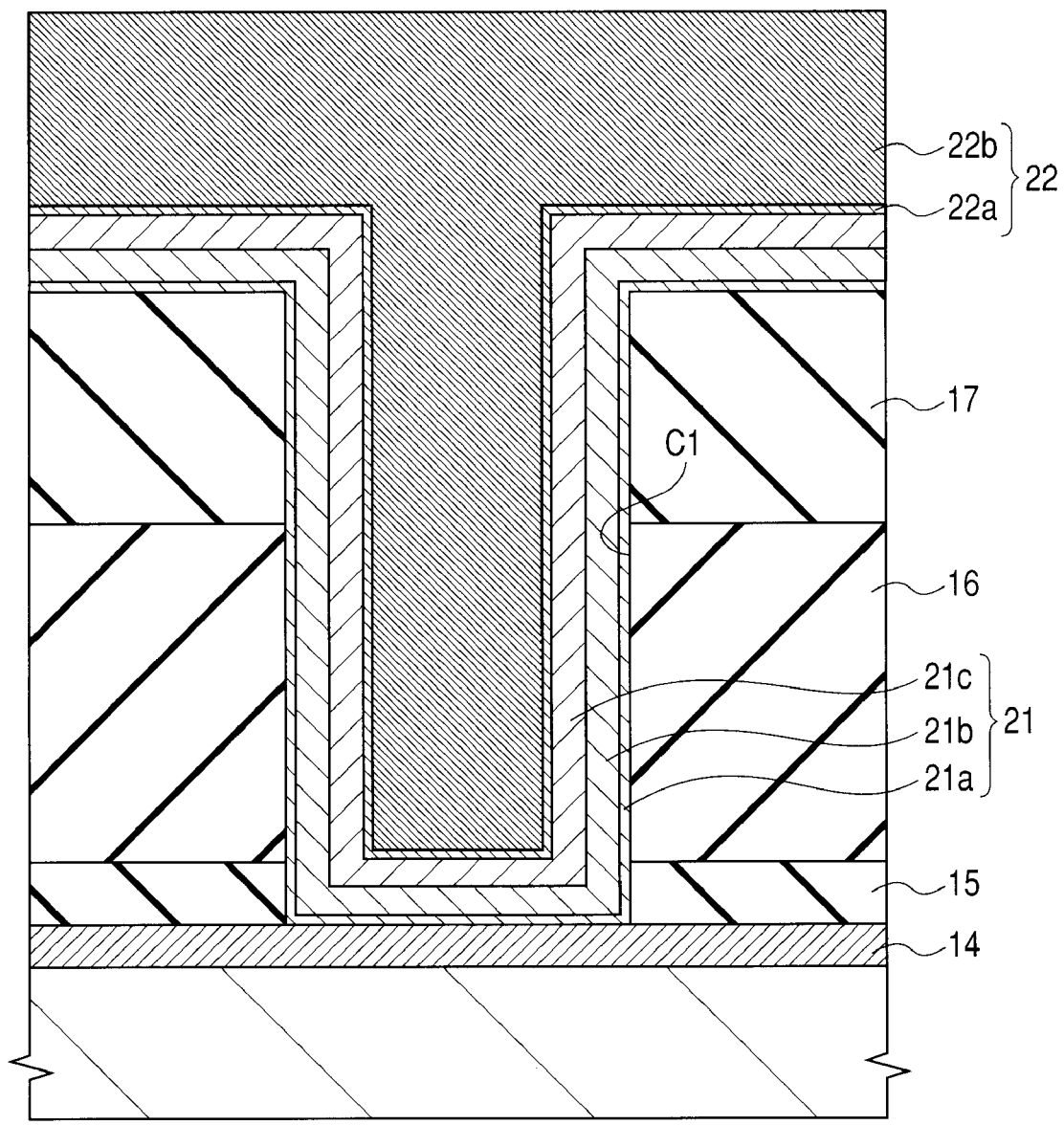
FIG. 13 is an enlarged cross-sectional view of the essential part of the inside of the contact hole in an SRAM manufacturing process subsequent to FIG. 12.
Figure 19:
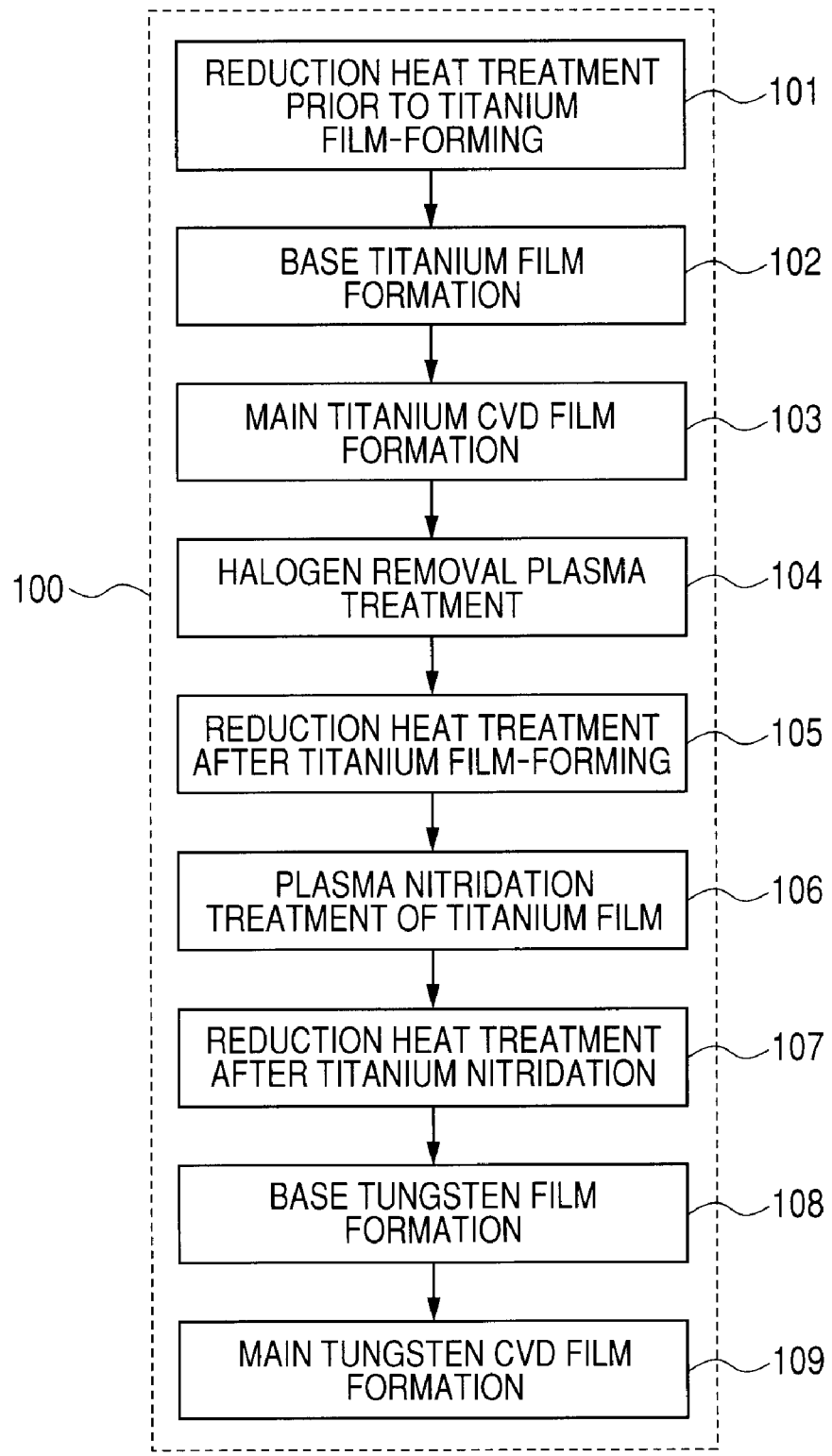
FIG. 19 is a process block flow diagram showing the flow of a contact hole embedding process in the method of manufacturing a semiconductor integrated circuit device according to one embodiment of the invention.

Next, one example of the method of manufacturing an SRAM according to the embodiment of the invention will be described using FIGS. 2 to 19 in the order of processes. FIGS. 2 to 9(*b*) are plan views or cross-sectional views of essential parts of an SRAM, FIG. 10 is a plan view of a film forming apparatus for barrier metal and the like, FIG. 11 is a schematic cross-sectional view of apparatus illustrating the outline of the structure of a film forming chamber (a CVD chamber) of a barrier metal film in FIG. 10, FIG. 12 is an enlarged cross-sectional view of the essential part showing a barrier metal film and a plug inside a contact hole, FIG. 13 is an enlarged cross-sectional view of the essential part showing the inside of the contact hole, FIGS. 14(*a*) to 18(*b*) are plan views or cross-sectional views of the essential parts of the SRAM, and FIG. 19 is a process block flow diagram showing process steps such as a film-forming process (including a pre-treatment, post-treatment, and other accompanying treatments) of barrier metal, and the like.

FIG. 2 is a plan view of essential part of a semiconductor substrate showing a region for about one memory cell, FIG. 3(*a*) is a cross-sectional view of the essential part of the semiconductor substrate showing a part (an A-A' line in FIG. 2) of the memory cell region, FIG. 3(*b*) is a cross-sectional view of the essential part of the semiconductor substrate showing a part of a peripheral circuit region, and, in the peripheral circuit region, a low-voltage MISFET constituting a logic circuit is exemplified.

Firstly, a semiconductor substrate 1 is prepared. The semiconductor substrate 1 is constituted of a substrate 1*a* made of p-type single crystal silicon having a specific resistance of, for example, around 1 to 10 Ωcm (for example, 300 φ wafer) and an epitaxial layer 1*b* formed by, for example, an epitaxial growth method. Meanwhile, in SOC (System On Chip) type semiconductor integrated circuit devices, a substrate 1*a* made of p-type single crystal silicon of a non-epitaxial type, or the like may be used. The wafer may have a diameter of 450 φ, 200 φ or other values, in addition to 300 φ. Hereinafter, the explanation will be given mainly with reference to a process of 45 nm node. On this occasion, the diameter of a contact hole having an approximately circular planar shape is around 55 nm.

Next, at the main face of the semiconductor substrate 1, an element isolation 2 is formed. The element isolation 2 is formed as follows. By etching the semiconductor substrate 1 using a resist pattern formed by a photolithographic method as a mask, an element isolation groove having a depth of, for example, around 0.3 μm (300 nm) to 0.5 μm (500 nm) is formed, then the semiconductor substrate 1 is thermally oxidized at a temperature of about 1000° C., and thereby a thin silicon oxide film having a thickness of, for example, around 0.01 μm (10 nm) is formed at the inner wall of the groove. The silicon oxide film is formed for recovering damage generated for the inner wall of the groove caused by dry etching, and for relaxing stress generated at the interface between an insulating film to be embedded inside the groove in the next process and the semiconductor substrate 1.

Next, at the main face of the semiconductor substrate 1 including the inside of the groove, an insulating film having a thickness of, for example, around 0.45 μM (450 nm) to 0.5 μM (500 nm) is deposited by a CVD method, the insulating film of the upper portion of the groove is polished by a chemical mechanical polishing (CMP) method, and the surface thereof is flattened.

Next, a p-type impurity (for example, boron) or an n-type impurity (for example, phosphorus) is ion-implanted to the main face of the semiconductor substrate 1, which is subjected to a heat treatment at a temperature of about 1000° C. to diffuse the impurity, thus forming a p-type well 4 and an n-type well 5 at the main face of the semiconductor substrate 1.

As shown in FIG. 2, in the memory cell MC, active regions An1, An2, Ap1 and Ap2 being the main surface of two p-type wells 4 and two n-type wells 5 are formed at the main face of the semiconductor substrate 1, wherein these active regions are surrounded by the element isolation 2 into which an insulating film has been embedded. Further, as will be described later, among 6 MISFETs (MISFETs for transfer (Tr1, Tr2), MISFETs for drive (Dr1, Dr2) and MISFETs for load (Ld1, Ld2)) constituting the memory cell MC, the nMISFETs (MISFET for transfer (Tr1) and MISFET for drive (Dr1)) are formed over the active region Ap1 (the p-type well 4), and the nMISFETs (MISFET for transfer (Tr2) and MISFET for drive (Dr2)) are formed over the active region Ap2 (the p-type well 4). Further, the pMISFET (MISFET for load (Ld2)) is formed over the active region An1 (the n-type well 5), and the pMISFET (MISFET for load (Ld1)) is formed over the active region An2 (the n-type well 5).

Figure 4:
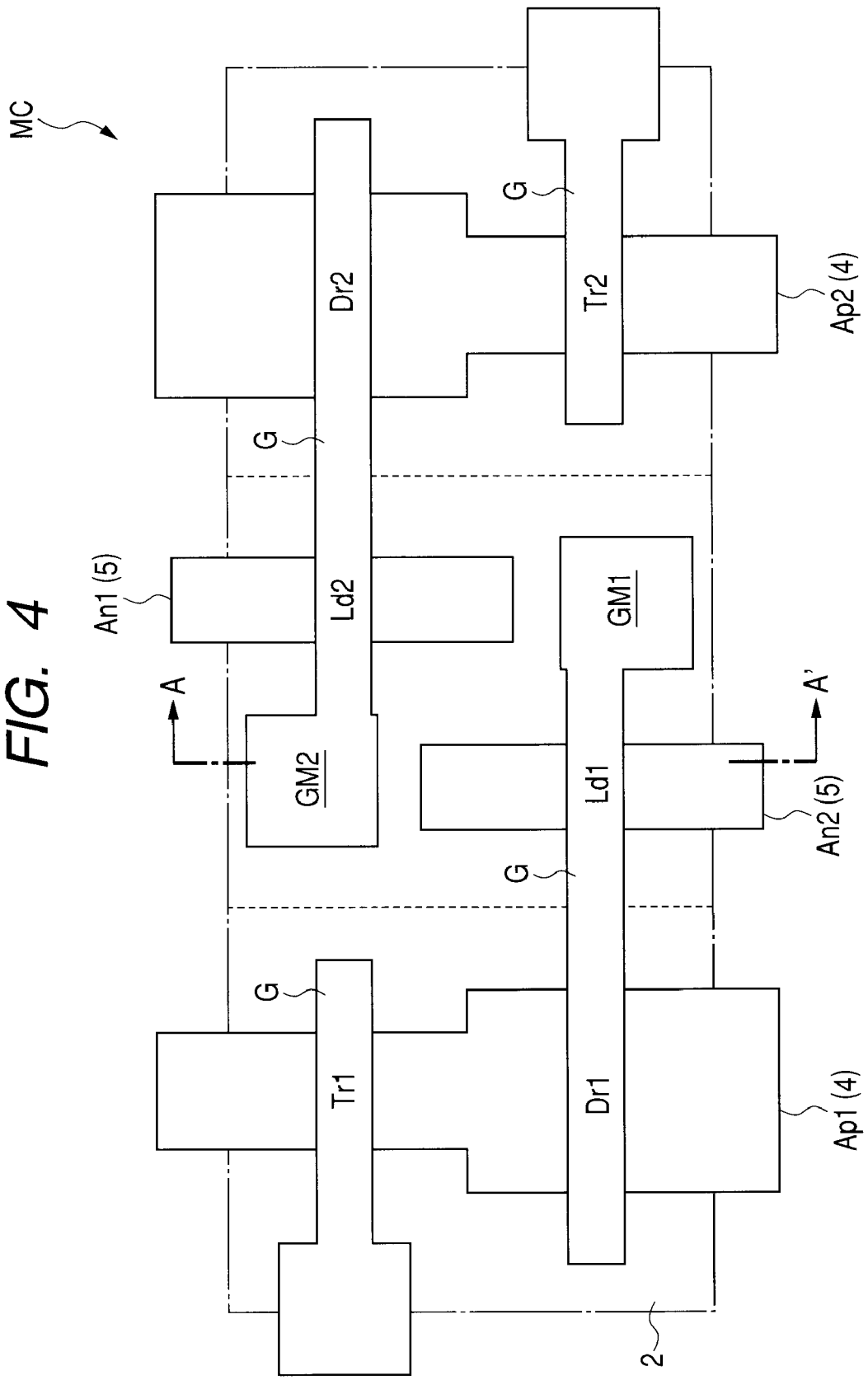
FIG. 4 is a plan view of the essential part of the same place as that in FIG. 2 in a manufacturing process subsequent to FIGS. 2, 3(a) and 3(b)

FIG. 4 is a plan view of the essential part of the same place as that in FIG. 2 in a manufacturing process subsequent to FIGS. 2 to 3(*b*), FIG. 5(*a*) is a cross-sectional view of the essential part of the same place as that in FIG. 3(*a*) in a manufacturing process subsequent to FIGS. 2 to 3(*b*), and FIG. 5(*b*) is a cross-sectional view of the essential part of the same place as that in FIG. 3(*b*) in a manufacturing process subsequent to FIGS. 2 to 3(*b*).

At the main surface of memory cell region of the semiconductor substrate 1, nMISFETs (MISFET for transfer (Tr1, Tr2), MISFETs for drive (Dr1, Dr2)) and pMISFETs (MISFET for load (Ld1, Ld2)) are formed, and, at the main surface of peripheral circuit region of the semiconductor substrate 1, an nMISFET (QnL) and a pMISFET (QpL) are formed.

Firstly, after wet washing the surface of the semiconductor substrate 1 (the p-type well 4 and n-type well 5) using a hydrofluoric acid-based cleaning solution, by performing thermal oxidization at a temperature of about 800° C., a clean gate insulating film 6 having a thickness of, for example, around 3 nm is formed at respective surfaces of the p-type well 4 and the n-type well 5. Meanwhile, a gate insulating film other than an oxidized silicon film may be used independently or in lamination with an oxidized silicon film-based insulating film.

Next, over the gate insulating film 6, a gate electrode G is formed. The gate electrode G is formed as follows. Firstly, at the upper portion of the gate insulating film 6, a low resistance polycrystalline silicon film having a thickness of, for example, around 0.2 μm (200 nm) is deposited by a CVD method. Subsequently, the polycrystalline silicon film is dry-etched using a resist pattern formed by a photolithographic method as a mask to form the gate electrode G made of a polycrystalline silicon film.

As shown in FIG. 4, in the memory cell MC, the gate electrode G of the MISFET for transfer (Tr1) and the gate electrode G of the MISFET for drive (Dr1) are formed over the active region Ap1, and the gate electrode G of the MISFET for transfer (Tr2) and the gate electrode G of the MISFET for drive (Dr2) are formed over the active region Ap2. Further, the gate electrode G of the MISFET for load (Ld2) is formed over the active region An1, and the gate electrode G of the MISFET for load (Ld1) is formed over the active region Ant. The gate electrode G of the MISFET for load (Ld1) and the gate electrode G of the MISFET for drive (Dr1) are common, and a lead portion GM1, to which local wiring is connected in a later process, is provided at the end of the gate electrode G. Further, similarly, the gate electrode G of the MISFET for load (Ld2) and the gate electrode G of the MISFET for drive (Dr2) are common, and a lead portion GM2, to which local wiring is connected in a later process, is provided at the end of the gate electrode G. The lead portions GM1 and GM2 are formed over the element isolation 2.

Next, an n-type impurity (for example, phosphorus) is ion-implanted to the p-type well 4 on both sides of the gate electrode G to form an n$^-$-type semiconductor region 7, and a p-type impurity (for example, arsenic) is ion-implanted to the n-type well 5 on both sides of the gate electrode G to form a p$^-$-type semiconductor region 8.

Figure 6A:
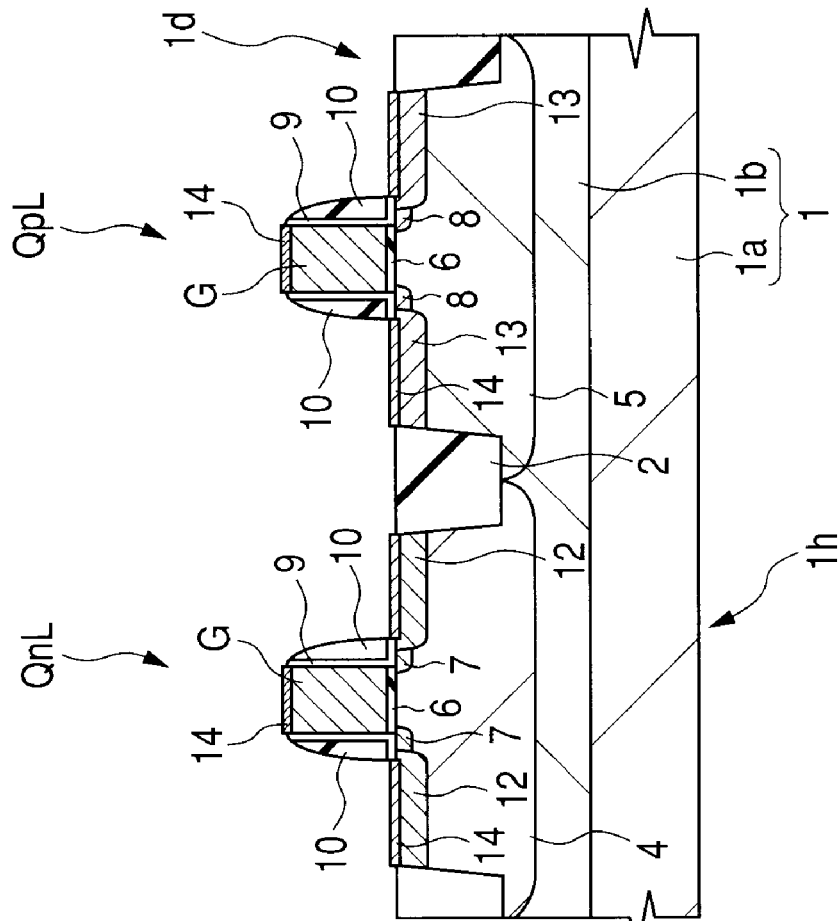
FIGS. 6(a) and 6(b) are cross-sectional views of the essential part of the same place as that in FIGS. 3(a) and 3(b) in a manufacturing process subsequent to FIGS. 4, 5(a) and 5(b)

FIG. 6(a) is a cross-sectional view of the essential part of the same place as that in FIG. 3(a) in a manufacturing process subsequent to FIGS. 4 to 5(b), and FIG. 6(b) is a cross-sectional view of the essential part of the same place as that in FIG. 3(b) in a manufacturing process subsequent to FIGS. 4 to 5(b).

After depositing a silicon oxide film 9 having a thickness of, for example, around 0.01 μm (10 nm) over the main face of the semiconductor substrate 1 by a CVD method, a silicon nitride film having a thickness of, for example, around 0.1 μm (100 nm) is deposited. Subsequently, by anisotropically etching the silicon nitride film by an RIE (Reactive Ion Etching) method, a sidewall 10 is formed at the side wall of the gate electrode G. In the etching, since the etching selection ratio of the silicon nitride film relative to the silicon oxide film may be set to, for example, around 7 to 10, the silicon oxide film 9 works as an etching stopper (an etch stop film) upon forming the sidewall 10.

Next, at the p-type well 4 on both sides of the gate electrode G, an n-type impurity (for example, phosphorus or arsenic) is ion-implanted to form an n$^+$-type semiconductor region (source, drain) 12, and, at the n-type well 5 on both sides of the gate electrode G, a p-type impurity (for example, boron) is ion-implanted to form a p$^+$-type semiconductor region (source, drain) 13. After that, the exposed silicon oxide film 9 is removed.

Next, at the exposed portion (the n$^+$-type semiconductor region 12, p$^+$-type semiconductor region 13) of the semiconductor substrate 1 and the surface of the gate electrode G, a low-resistance nickel silicide (NiSi) layer 14 is formed by a salicide technique. Meanwhile, here the nickel silicide layer 14 is exemplified, but another silicide layer, for example, a metal silicide layer such as a nickel alloy silicide layer (that is a nickel-based metal silicide layer), a cobalt silicide layer, a tungsten silicide layer, or a platinum silicide layer may also be formed. The nickel silicide layer 14 is formed by, for example, a method described below.

Firstly, a nickel film and a titanium nitride film are successively deposited over the main face of the semiconductor substrate 1 by a sputtering method. The nickel film has a thickness of, for example, 0.01 μm (10 nm), and the titanium nitride film has a thickness of, for example, 0.015 μm (15 nm). The titanium nitride film is deposited over the nickel film in order to prevent the oxidation of the nickel film, and a titanium film may be used in place of the titanium nitride film. Subsequently, by subjecting the semiconductor substrate 1 to a heat treatment, for example, at a temperature of about 410° C. for around 30 seconds using an RTA (Rapid Thermal Anneal) method, the nickel film and the polycrystalline silicon film constituting the gate electrode G, and the nickel film and the single crystal silicon constituting the semiconductor substrate 1 for which the n$^+$-type semiconductor region 12 or p$^+$-type semiconductor region 13 has been formed are allowed to react selectively to form a nickel silicide layer 14. Subsequently, after removing an unreacted nickel film and titanium nitride film by wet washing using sulfuric acid, wet washing using sulfuric acid and hydrogen peroxide solution, or the like, the semiconductor substrate 1 is subjected, at a temperature of, for example, about 590° C., to a spike annealing treatment (that is, a treatment in which the holding time at 590° C. is substantially zero second) using an RTA method, to lower resistance of the nickel silicide layer 14.

Processes up to here completes six MISFETs (MISFETs for drive (Dr1, Dr2), MISFETs for transfer (Tr1, Tr2) and MISFETs for load (Ld1, Ld2)) constituting the memory cell MC, and the nMISFET (QnL) and pMISFET (QpL) in the peripheral circuit region.

Figure 6B:
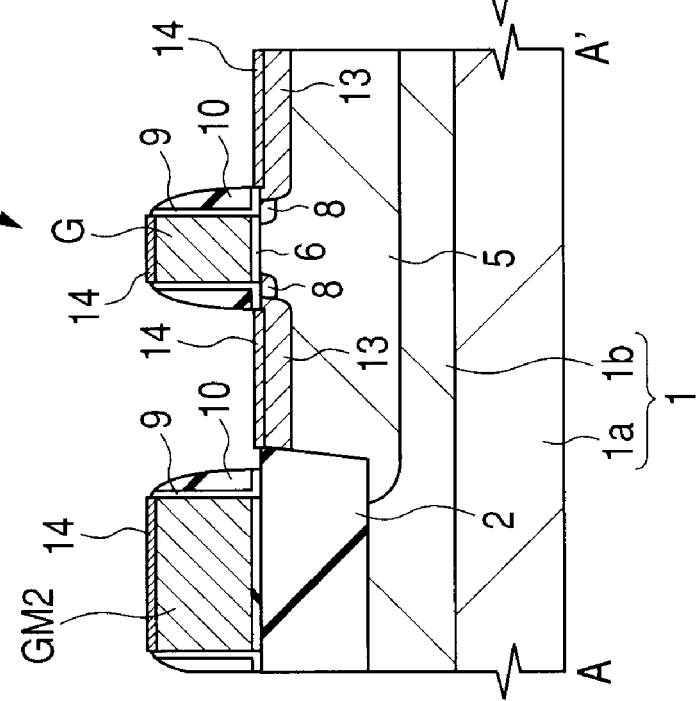
Figure 7:
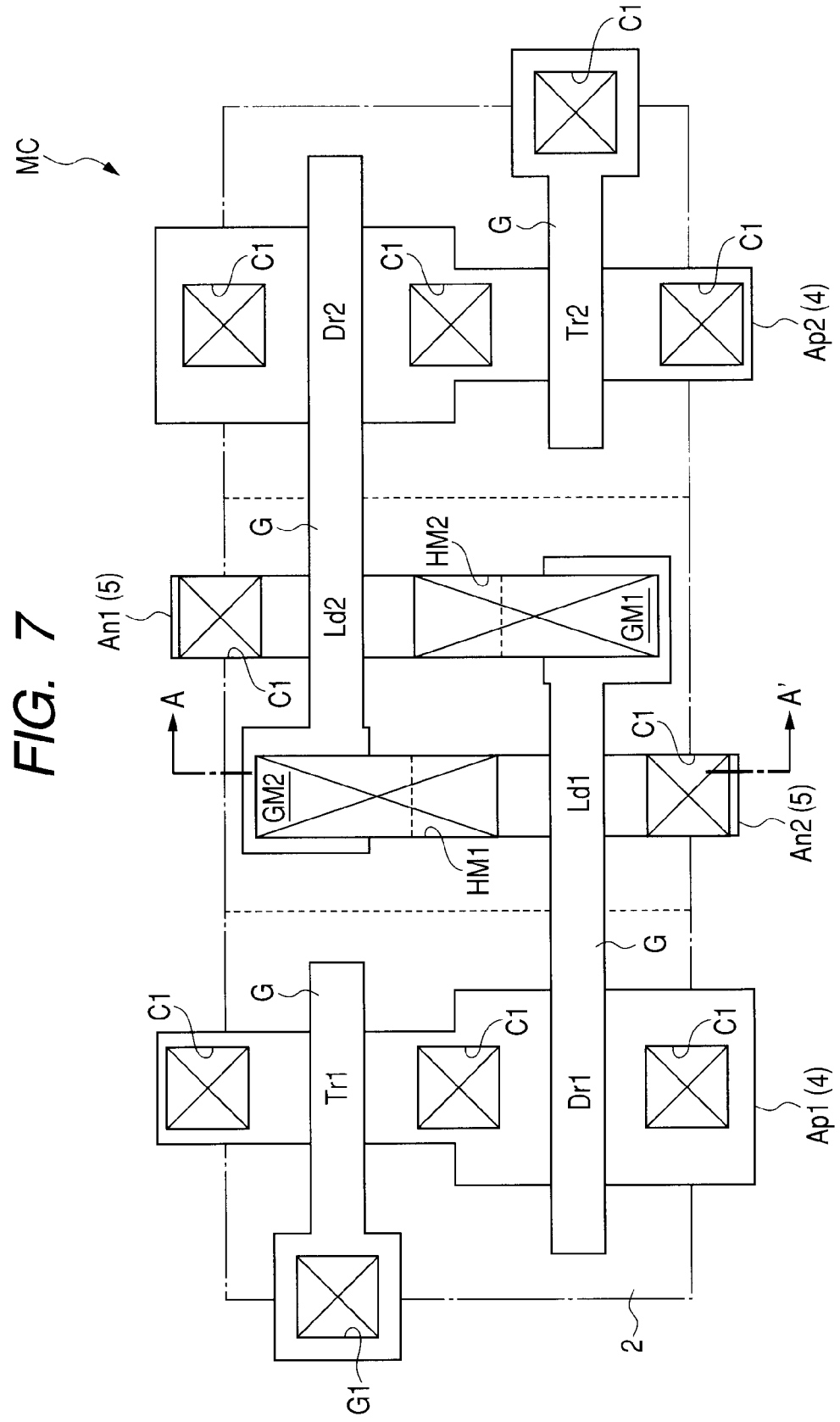
FIG. 7 is a plan view of the essential part of the same place as that in FIG. 2 in a manufacturing process subsequent to FIGS. 6(a) and 6(b)

FIG. 7 is a plan view of the essential part of the same place as that in FIG. 2 in a manufacturing process subsequent to FIGS. 6(a) and 6(b), FIG. 8(a) is a cross-sectional view of the essential part of the same place as that in FIG. 3(a) in a manufacturing process subsequent to FIGS. 6(a) and 6(b), and FIG. 8(b) is a cross-sectional view of the essential part of the same place as that in FIG. 3(b) in a manufacturing process subsequent to FIGS. 6(a) and 6(b).

Next, a silicon nitride film 15 having a thickness of, for example, around 0.03 to 0.05 μm (30 to 50 nm) is deposited over the semiconductor substrate 1 by a CVD method. Meanwhile, the silicon nitride film 15 works as an etching stopper upon forming a contact hole and the like described later.

Next, over the silicon nitride film 15, a PSG (Phosphor Silicate Glass) film 16 is formed, which is heat treated and flattened, and, after that, a silicon oxide film 17 is deposited. The silicon oxide film 17 is formed using, for example, tetraethoxysilane as a raw material by a plasma CVD method. The silicon nitride film 15, the PSG film 16 and the silicon oxide film 17 become an interlayer insulating film formed between, for example, the gate electrode G and wiring, which is to be formed later. Further, after depositing the silicon oxide film 17 having a thickness of, for example, around 0.7 to 0.8 μm (700 to 800 nm) over the silicon nitride film 15 by a CVD method, the surface of the silicon oxide film 17 may be polished by a CMP method to be flattened.

Next, by dry etching the silicon oxide film 17 and the PSG film 16 using a resist pattern formed by a photolithographic method as a mask, and, subsequently, dry etching the silicon nitride film 15, a contact hole C1 is formed over the n$^+$-type semiconductor region 12 and the p$^+$-type semiconductor region 13, and further a first and second wiring grooves (a common opening portion (shared contact)) HM1 and HM2 are formed. Further, the contact hole C1 is formed over the lead portion of the gate electrode G of the MISFET for transfer (Tr1, Tr2).

Of two first and second wiring grooves HM1 and HM2, the first wiring groove HM1 extends from over the drain of the MISFET for load (Ld1) to over the lead portion GM2 of the gate electrode G that is common to the MISFET for load (Ld2) and the MISFET for drive (Dr2) constituting the CMOS inverter INV2. That is, the first wiring groove HM1 is one groove that has in common a contact hole coupling the lead portion GM2 of the gate electrode G and local wiring to be formed later, and a contact hole coupling the drain of the MISFET for load (Ld1) and the local wiring. Further, the second wiring groove HM2 extends from over the drain of the MISFET for load (Ld2) to over the lead portion GM1 of the gate electrode G that is common to the MISFET for load (Ld1) and the MISFET for drive (Dr1) constituting the CMOS inverter INV1. That is, the second wiring groove HM2 is one groove that has in common a contact hole coupling the lead portion GM1 of the gate electrode G and local wiring to be formed later, and a contact hole coupling the drain of the MISFET for load (Ld2) and the local wiring.

Upon forming the contact hole C1, and the first and second wiring grooves HM1 and HM2, firstly, the silicon oxide film 17 and the PSG film 16 are dry etched while making the silicon nitride film 15 function as an etching stopper. In the etching, since the etching selection ratio of the silicon oxide film 17 or the PSG film 16 relative to the silicon nitride film 15 is, for example, around 20 to 30, the silicon nitride film 15 plays a role as the etching stopper for the silicon oxide film 17 and the PSG film 16.

Next, the exposed silicon nitride film 15 is dry etched. On this occasion, in order to surely expose the nickel silicide layer 14 formed at the surface of the $p^+$-type semiconductor region 13 where the first and second wiring grooves HM1 and HM2 are formed, and nickel silicide layer 14 formed at the surface of the lead portion GM1 of the gate electrode G that is common to the MISFET for load (Ld1) and the MISFET for drive (Dr1) constituting the CMOS inverter INV1 and at the surface of the lead portion GM2 of the gate electrode G common to the MISFET for load (Ld2) and the MISFET for drive (Dr2) constituting the CMOS inverter INV2, the silicon nitride film 15 is over-etched. In the over-etching, the side wall 10 formed at the sidewall of the lead portion GM1 of the gate electrode G that is common to the MISFET for load (Ld1) and the MISFET for drive (Dr1) constituting the CMOS inverter INV1, and the lead portion GM2 of the gate electrode G that is common to the MISFET for load (Ld2) and the MISFET for drive (Dr2) constituting the CMOS inverter INV2 is occasionally etched to expose the end portion of the nickel silicide layer 14 or a polycrystalline silicon film constituting the lead portions GM1 and GM2 of the gate electrode G. As the result, there is such possibility that a place, where an oxide film grows, partially exists at the surface of the nickel silicide layer 14.

2. Explanation of an essential part of a wafer process in a method of manufacturing a semiconductor integrated circuit device of one embodiment of the application, an apparatus for use in the process, and a CMIS SRAM being one example of target device and the like (mainly from FIGS. 9(a) to 14(b), and FIG. 19). In this section, continuously to the section 1, a contact hole embedding process 100 (FIG. 19), which is an essential part of a wafer process in a method of manufacturing a semiconductor integrated circuit device of one embodiment of the application, and a film forming apparatus for use in the process, and the like are described as a central theme.

Figure 8:
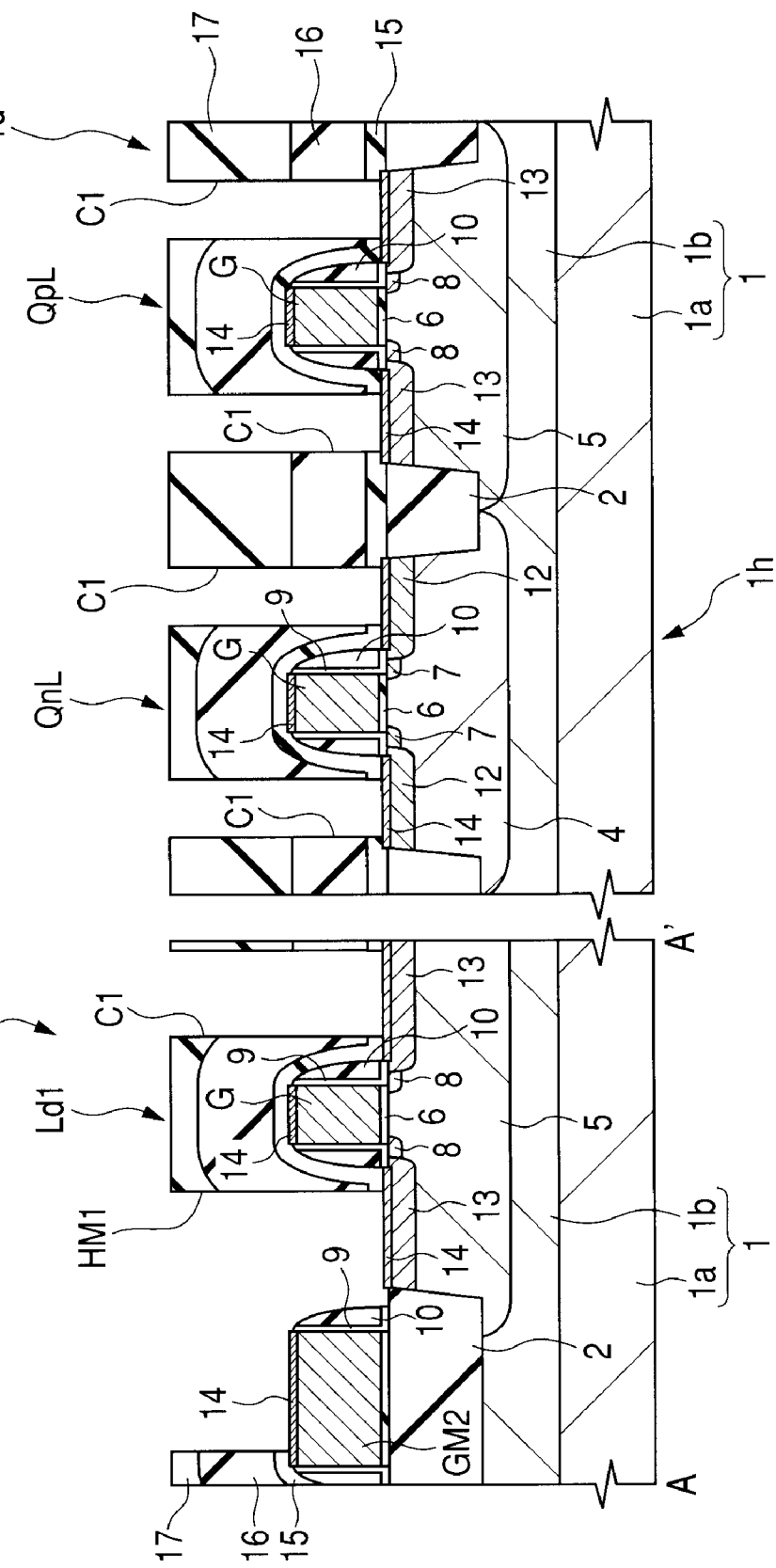
FIGS. 8(a) and 8(b) are cross-sectional views of the essential part of the same place as that in FIGS. 3(a) and 3(b) in a manufacturing process subsequent to FIGS. 6(a) and 6(b)
Figure 9:
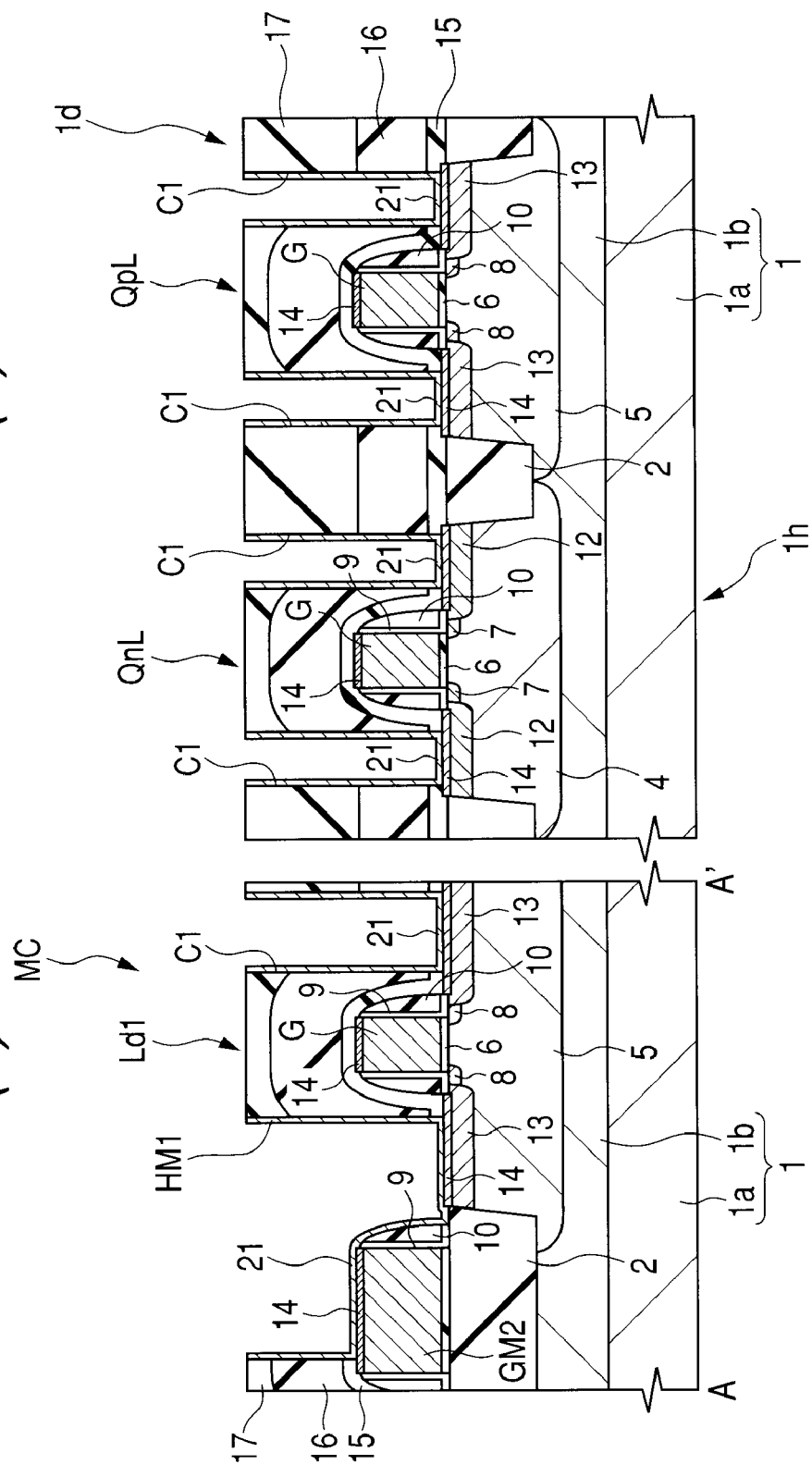
FIGS. 9(a) and 9(b) are cross-sectional views of the essential part of the same place as that in FIGS. 3(a) and 3(b) in a manufacturing process subsequent to FIGS. 7, 8(a) and 8(b)

FIG. 9(a) is a cross-sectional view of the essential part of the same place as that in FIG. 3(a) in a manufacturing process subsequent to FIGS. 7 to 8(b), and FIG. 9(b) is a cross-sectional view of the essential part of the same place as that in FIG. 3(b) in a manufacturing process subsequent to FIGS. 7 to 8(b).

As shown in FIGS. 9(a) and 9(b), 12 and 13, over the contact hole C1, and the silicon oxide film 17 including the inside of the first and second wiring grooves HM1 and HM2, a titanium film and a titanium nitride film are successively formed by a CVD method to form a barrier metal film 21 made of the laminated film. Since the titanium film can achieve solid solution with an oxygen atom up to 12 at %, it is used as a reducing material of the surface of the nickel silicide layer 14, and has a function of lowering the contact resistance with the nickel silicide layer 14. Further, the titanium nitride film has a function of suppressing or preventing the diffusion of a constitutional atom of a metal film embedded inside the contact hole C1, and the first and second wiring grooves HM1 and HM2 in a later process. The barrier metal film 21 has a thickness of, for example, 3 to 10 nm. Meanwhile, in the description below, the titanium film and the titanium nitride film formed thereover are referred to as a barrier metal film 21, which is distinguished from a metal film, for example, a tungsten film or a copper film, embedded inside the contact hole C1, and the first and second wiring grooves HM1 and HM2 to be a main electroconductive material.

For forming the barrier metal film 21, a film forming apparatus 50 shown in FIG. 10 is used. The film forming apparatus 50 is of a multi-chamber type provided with a load lock chamber 53 and four chambers 54, 55, 56 and 57 around a transferring chamber 51 via a gate valve 52 being an opening and closing means. On the side of the load lock chamber 53 opposite to the transferring chamber 51, a wafer transfer-in-and-out chamber 58 is provided, and on the side of wafer transfer-in-and-out chamber 58 opposite to the load lock chamber 53, a FOUP (Front Open Unified Pod) 59 for housing a semiconductor wafer SW (in the embodiment, the semiconductor substrate having the structure shown in FIGS. 9(a) and 9(b) described above), that is, a port 60 to which a wafer transfer vessel is attached, is provided.

The transferring chamber 51 is held at a prescribed degree of vacuum by an evacuation mechanism and the like, and at the center portion thereof, a transferring robot 61 (vacuum transfer robot) of a multi-articulated arm structure for transferring the semiconductor wafer SW is provided.

The chamber 54 is a chamber for dry cleaning procedure, the chamber 55 is a chamber for a heat treatment that performs a heat treatment at such high temperature as, for example, 150° C. or more (a post-washing heat treatment chamber), the chamber 56 is a chamber for forming a barrier metal film (a titanium CVD chamber), and the chamber 57 is a tungsten CVD chamber, which are provided to the transferring chamber 51. Meanwhile, for the film forming apparatus 50, the number of chambers provided to the transferring chamber 51 is set to four, but it is not limited to four, and a chamber for the same application or a chamber for another application may be added. Note that, here, the tungsten CVD chamber is disposed in the titanium film forming apparatus 50, but it may be disposed in another apparatus.

FIG. 11 is a schematic cross-sectional view of the chamber 56 for film-forming provided at the film forming apparatus 50. The chamber 56 is a chamber used for forming the barrier metal film 21 by a CVD method (treatment chamber, reaction chamber) over the semiconductor wafer SW (that is, the semiconductor substrate 1), for example, a chamber of a parallel plate plasma CVD apparatus. Meanwhile, the plasma excitation type of a plasma CVD apparatus is not limited to a parallel plate type, that is, a capacity coupling type, but may be an ICP type, an electron cyclotron resonance type, a helicon type or the like. Further, it is not limited to an In-Situ type, and may be a remote plasma type.

As shown in FIG. 11, the chamber 56 is a treatment chamber that can be vacuum tightly sealed, and in the chamber 56, a lower electrode (a substrate electrode) 66 and an upper electrode (a high-frequency electrode) 67 facing each other are arranged. The lower electrode 66 is configured so that the semiconductor wafer SW (that is, the semiconductor substrate 1) may be disposed thereover, and incorporates a heating mechanism such as a heater, which is not shown. Further, it is configured so that high-frequency power or high-frequency voltage of, for example, around 450 kHz may be supplied (applied) to the upper electrode 67 by a high-frequency power source 63 provided outside the chamber 56 or the like. On the other hand, the other end of the high-frequency power source 63 (the side not coupled to the upper electrode 67), the lower electrode 66 and the inner wall of the chamber 56 are grounded. Meanwhile, the high-frequency power may have a single frequency as this example, or may have multiple high-frequency powers that can be controlled independently.

Further, the chamber 56 is configured so that an intended gas in an intended flow volume can be introduced therein from a gas feed port 68 provided at the upper electrode 67. For example, the gas feed port 68 is connected to an introduction route of gas that is to be necessary (here, $TiCl_4$ gas, $NH_3$ gas, $H_2$ gas, $N_2$ gas and Ar gas) via a mass flow controller (a gas flow volume controlling apparatus) 64, which is configured so as to allow an intended kind of gas (gas selected from $TiCl_4$, $NH_3$, $H_2$, $N_2$ and Ar) in an intended flow volume from the gas feed port 68 to be introduced into the chamber 56.

Further, the chamber 56 is configured so as to be connected to a gas exhaust means (for example, a vacuum pump), which is not shown, via a gas exhaust port 65, and to evacuate inside of the chamber 56 from the gas exhaust port 65 at an intended evacuation rate. Further, it is configured so that a pressure control portion, which is not shown, may adjust the evacuation rate from the gas exhaust port 65 and the like in response to pressure in the chamber 56 detected by a pressure sensor or the like and maintain the inside of the chamber 56 at an intended pressure.

Firstly, one semiconductor wafer SW is taken out of any of FOUPs 59 by a transferring robot 62 disposed in the wafer transfer-in-and-out chamber 58, and transferred into any of load lock chambers 53. The FOUP 59 is a sealed storage vessel for batch transfer of the semiconductor wafer SW, and, usually, stores semiconductor wafers SW in a batch unit such as 25, 12, or 6. The vessel exterior wall of the FOUP 59 has a sealed structure excluding a fine vent filter portion to eliminate dust approximately completely. Accordingly, it is configured so that, even when the transfer is performed under an atmosphere of class 1,000, the inside can be kept to a cleanliness of class 1. The docking with the film forming apparatus 50 is performed in a state where cleanliness is held by attaching a door of the FOUP 59 to a port 60, and bringing it inside the wafer transfer-in-and-out chamber 58. Subsequently, after evacuating the inside of the load lock chamber 53, the semiconductor wafer SW is transferred to the transferring chamber 51 by the transferring robot 61.

Next, the semiconductor wafer SW is vacuum-transferred from the transferring chamber 51 to the chamber 54 for a dry cleaning treatment by the transferring robot 61, and mounted on a wafer stage provided at the chamber 54. The wafer stage of the chamber 54 is provided with a mechanism that electrostatically adsorbs the semiconductor wafer SW to hold it, thereby effectively controlling the temperature of the semiconductor wafer SW. Upon the dry cleaning treatment, by introducing Ar gas, to which a reducing gas, for example, HF gas and $NH_3$ gas have been added, into the chamber 54 and supplying it over the main face of the semiconductor wafer SW via a shower head, a reduction reaction occurs between the reducing gas and a natural oxide film formed at the surface of the nickel silicide layer 14 according to, for example, formula (1), to remove the natural oxide film. The process condition upon the dry cleaning treatment is, for example, wafer stage temperature 25° C., HF gas flow volume 80 sccm, NH3 gas flow volume 38 sccm, Ar gas flow volume 5 sccm, and pressure 1.3 Pa.

$$SiO_2+6HF+2NH_3 \rightarrow (NH_4)_2SiF_6+2H_2O \qquad \text{formula (1)}$$

At this time, a product generated by the reducing reaction $((NH_4)_2SiF_6)$ remains over the main face of the semiconductor wafer SW including the inside of the contact hole C1, and the first and second wiring grooves HM1 and HM2.

Next, the semiconductor wafer SW is vacuum-transferred from the chamber 54 for a dry cleaning treatment to the chamber 55 for a heat treatment via the transferring chamber 51 by the transferring robot 61 and is mounted on the stage provided at the chamber 55. By mounting the semiconductor wafer SW on the stage of the chamber 55, the semiconductor wafer SW is heated at a prescribed temperature to sublimate and remove the product remaining over the main face of the semiconductor wafer SW. The temperature at the main face of the semiconductor wafer SW is considered suitably to be within a range of, for example, 150 to 400° C. (needless to say, it is not limited to this range in another condition). Further, as a range suitable for mass production, 165 to 350° C. is considered, and, further, a range having a central value of 200° C. such as 180 to 220° C. is considered to be most favorable.

After that, the barrier metal film 21 is formed. Since products generated at the bottom face and side face of the contact hole C1, and the first and second wiring grooves HM1 and HM2 upon the dry cleaning procedure have been removed by applying heat treatment of 150 to 400° C. to the semiconductor substrate 1 after the process of the dry cleaning treatment, the variation of contact resistance between the barrier metal film 21 and the nickel silicide layer 14 at the bottom face of the contact hole C1, and the first and second wiring grooves HM1 and HM2 can be decreased. Further, peeling of the barrier metal film 21 at the side face of the contact hole C1, and the first and second wiring grooves HM1 and HM2 can be prevented. However, by the aforementioned over etching upon forming the contact hole C1, and the first and second wiring grooves HM1 and HM2, in places where the edge portion of the nickel silicide layer 14 or the polycrystalline silicon film constituting the lead portions GM1 and GM2 of the gate electrode G is exposed, an oxide film grown to the surface of the nickel silicide layer 14 cannot be removed by the dry cleaning treatment and the heat treatment to remain there.

Meanwhile, in the dry cleaning treatment, HF gas and $NH_3$ gas are used as a reducing gas, but a reactive gas such as a reducing gas is not limited to the aforementioned gas. It may be a gas that reacts with the oxide film at relatively low temperatures to generate a reaction species that vaporizes. For example, as the reducing gas, $NF_3$ gas and $H_2$ gas may be employed.

Further, in the aforementioned dry cleaning treatment, a reactive gas such as a reducing gas is introduced into the chamber 54 to remove the natural oxide film by a reduction reaction, but plasma may also be used. For example, it is also possible to excite a reducing gas, for example, Ar gas (Ar gas is frequently used as a plasma exciting gas, but other rare gases or a mixed gas thereof is also usable) to which $NF_3$ gas and $NH_3$ gas are added in a remote plasma generation apparatus to generate plasma, which is introduced into the chamber 54 to remove the natural oxide film by a reduction reaction.

Next, the semiconductor wafer SW is vacuum-transferred from the chamber 55 for a heat treatment to the chamber 56 for forming a barrier metal film by the transferring robot 61 via the transferring chamber 51, and mounted on the stage 66 provided at the chamber 56. Usually, it is adsorbed on the stage 66 by an electrostatic chuck.

In the chamber 56, the barrier metal film 21 is formed over the main face of the semiconductor wafer SW mainly by a PECVD method described below. Here, typical methods for forming the barrier metal film 21 will be described, but the method of forming the barrier metal film 21 is not limited to these, and various changes are possible.

That is, in the present embodiment, a method, in which a titanium film is formed and, after that, the upper surface thereof is nitrided to form a barrier metal film constituted of a lower layer titanium film, an upper layer titanium nitride film and the like, is shown, but, for example, a titanium nitride film may further be formed over a titanium film having been formed. As the technology for forming the titanium nitride film, for example, there are a reactive PVD (Physical Vapor Deposition) method, an MOCVD (Metal Organic Chemical Vapor Deposition) method and the like.

A typical method of forming the barrier metal film 21 and a pre-treatment thereof (the first half of the contact hole embedding process 100 in FIG. 19) will be described using FIGS. 11 and 12, while referring to FIG. 19.

Firstly, a reduction heat treatment prior to titanium film-forming 101 in FIG. 19 is started. As shown in FIG. 11, the semiconductor wafer SW is mounted on the stage 66 which has been heated to a prescribed temperature, for example, 450° C. with a heater, so that a device surface 1d thereof faces upward. The stage 66 is always heated to the prescribed temperature, for example, 450° C., not otherwise specified particularly. By the evacuation mechanism, ammonia gas, Ar gas and $H_2$ gas are introduced into the chamber so that the inside of the chamber 56 has a prescribed pressure, for example, 667 Pa, via an exhaust port 65. The flow volume of the ammonia gas is, for example, 500 sccm, the flow volume of the Ar gas is, for example, 800 sccm, and the flow volume of the $H_2$ gas is, for example, 4000 sccm. The heat treatment time is, for example, around 15 seconds. As a favorable range, for example, around 5 seconds to 30 seconds can be exemplified. At this time, the plasma is in an OFF state. By the heat treatment, a silicon oxide film (a natural oxide film and the like) at the upper surface of the nickel silicide film 14, which remains because it could not be removed by the dry cleaning treatment and heat treatment in the chambers 54 and 55, is effectively removed. Meanwhile, the stage temperature, the flow volume of the $H_2$ gas, the flow volume of the Ar gas, the degree of vacuum during the treatment (which may change in gas substitution) and the like are basically left to the aforementioned values until the completion of a plasma nitridation treatment of titanium film 106 in FIG. 19. Note that, the upper limit of the preset temperature of the wafer stage 66 is considered to be around 600° C. from the standpoint of preventing the generation of unintended disilicide. Further, the lower limit thereof is considered to be around 300° C., while taking the necessity of sufficient occurrence of the catalytic action of nickel, titanium and the like into consideration. Accordingly, from the consideration that treatments performed on the same stage are advantageously performed at the same temperature in terms of efficiency, as a favorable range, the range of around 350° C. to 550° C. is exemplified.

The vapor phase atmosphere (first non-plasma reducing vapor phase atmosphere) of the reduction heat treatment prior to titanium film-forming is favorably a non-plasma atmosphere. Note that, the exciting gas atmosphere by remote plasma is not a non-plasma atmosphere. A non-plasma atmosphere is utilized because a plasma atmosphere might allow nitridation for the nickel silicide film 14 to be preceded to raise electric resistance despite the intention. The reducing vapor phase atmosphere favorably contains a reducing gas species having a nitrogen-hydrogen bond (a bond between nitrogen and hydrogen) as one of main gas components. Specific examples thereof include ammonia, hydrazine (vapor) and the like, and mixed gases thereof. But, from the standpoint of easy handling, ammonia is most favorable. Here, a gas species having a nitrogen-hydrogen bond is incorporated as one of main gas components because active hydrogen tends to generate easily by a catalytic action of nickel or the like in the silicide. Meanwhile, the reducing vapor phase atmosphere contains, usually, an inert gas such as argon to easily stand plasma, and hydrogen gas (usually the most plentiful component in the composition) as a carrier gas (simultaneously reducing gas), and the like, as the main constituent. Further, to the reducing vapor phase atmosphere, another gas having a weak reactivity such as nitrogen may be added. However, under usual conditions, oxygen gas and halogen gas having a strong reactivity, and organic-based gases are not favorable as an addition gas. The description above is directly applicable to the vapor phase atmosphere (non-plasma reducing vapor phase atmosphere) of a reduction heat treatment after titanium film-forming 105 (a second non-plasma reducing vapor phase atmosphere) in FIG. 19 described later.

After completing the heat treatment, only the ammonia gas is stopped (position of the wafer, state, degree of vacuum, stage temperature, other gas flows, ON/OFF of plasma and the like are the same as those in the reduction heat treatment prior to titanium film-forming 101), and the gas in the treatment chamber 56 is substituted. When completing the gas substitution, a base titanium film formation treatment 102 in FIG. 19 is started. Without changing other conditions, the feed of $TiCl_4$ gas being a titanium source gas to the treatment chamber 56 is started. That is, $TiCl_4$ gas is introduced into the chamber 56 to selectively form a titanium film (hereinafter, written as a heat reaction Ti film) 21a caused by a heat reaction at the surface of the nickel silicide layer 14. The flow volume of the $TiCl_4$ gas is, for example, 6.7 sccm, and the heat treatment time is, for example, around 30 seconds. As a favorable range, for example, around 5 to 40 seconds can be exemplified. The heat reaction Ti film 21a has a thickness of, for example, 1 nm or less. Here, the heat reaction Ti film 21a is formed only at the bottom face of the contact hole C1, and the surface of the nickel silicide layer 14 exposed at the bottom portion of the first and second wiring grooves HM1 and HM2, but is not formed at the side face of the contact hole C1, the side wall of the first and second wiring grooves HM1 and HM2, or the upper surface of the silicon oxide film 17. However, even at the bottom face of the first and second wiring grooves HM1 and HM2, when an oxide film exists at the surface of the nickel silicide layer 14, no heat reaction Ti film 21a is formed at the bottom face of the first and second wiring grooves HM1 and HM2.

When the base titanium film formation treatment 102 is completed, in the unchanged state, the high-frequency power source 63 in FIG. 11 turns ON to generate plasma in the treatment chamber 56, to start the main titanium CVD film formation treatment 103 in FIG. 19. That is, by applying high-frequency power to generate plasma in the chamber, a titanium film (hereinafter, written as a plasma reaction Ti film) 21b is formed over the heat reaction Ti film 21a. The flow volume of the TiCl$_4$ gas is, for example, 6.7 sccm, the high-frequency power is, for example, 800 W at 450 kHz, and the film-forming time is, for example, 25 seconds. The plasma reaction Ti film 21b has a thickness of, for example, 3 to 7 nm.

When the main titanium CVD film formation treatment 103 is completed, the feed of only the TiCl$_4$ gas is stopped, and in the unchanged state, the halogen removal plasma treatment 104 (a hydrogen plasma treatment) is started. That is, only the introduction of the TiCl$_4$ gas into the chamber 56 is stopped and a plasma treatment of the plasma reaction Ti film 21b by the H$_2$ gas is performed, to lower the chlorine concentration of the plasma reaction Ti film 21b, and, further, to reduce the oxide film remaining between the plasma reaction Ti film 21b at the bottom portion of the first and second wiring grooves HM1 and HM2, and the nickel silicide layer 14 (when an oxide film exists at the bottom portion of the first and second wiring grooves HM1 and HM2, no heat reaction Ti film 21a is formed). Plasma treatment time by hydrogen plasma is, for example, around 5 seconds. As a favorable range of the plasma treatment time by hydrogen plasma, for example, 5 to 30 seconds can be exemplified.

When the hydrogen plasma treatment 104 in FIG. 19 is completed, the plasma is turned to OFF state, and gas substitution is performed. When the gas substitution is completed, the feed of ammonia gas is started (a second non-plasma reducing vapor phase atmosphere), and the reduction heat treatment after titanium film-forming 105 (the second non-plasma reducing vapor phase atmosphere) in FIG. 19 is started. That is, NH$_3$ gas is introduced into the chamber to nitride the surface of the plasma reaction Ti film 21b by a heat reaction, and reduces the oxide film remaining between the plasma reaction Ti film 21b at the bottom portion of the first and second wiring grooves HM1 and HM2, and the nickel silicide layer 14. The flow volume of the NH$_3$ gas is, for example, 500 sccm, and the heat treatment time is, for example, around 10 seconds. A favorable range of the heat treatment time is 5 to 90 seconds. Note that, the process is not indispensable when the reduction heat treatment prior to titanium film-forming 101 is performed, but, by performing it, further effect may be expected for lowering the contact resistance and the like.

When the reduction heat treatment after titanium film-forming 105 in FIG. 19 is completed, in the unchanged state, a plasma high-frequency power source 63 is turned to ON state to start the plasma nitridation treatment of titanium film 106 in FIG. 19. That is, high-frequency power is applied to generate plasma, thereby forming a titanium nitride film that contains a slightly greater amount of nitrogen than the stoichiometric composition (hereinafter, written as a nitrogen-rich TiN film) 21c, for example, Ti$_1$N$_{1.1}$ film at the surface of the plasma reaction Ti film 21b, and, further, reducing the oxide film remaining between the plasma reaction Ti film 21b at the bottom portion of the first and second wiring grooves HM1 and HM2, and the nickel silicide layer 14. The high-frequency power is, for example, 800 W at 450 kHz, and the nitridation treatment time is, for example, around 25 seconds. As a favorable range of the nitridation treatment time, for example, around 10 to 90 seconds may be exemplified. Note that, the atmosphere is not limited to the reducing plasma atmosphere (a remote plasma atmosphere is also allowable) containing hydrogen, argon (an inert gas), ammonia or the like as a main constituent, which is mentioned here, but only a reducing gas atmosphere containing a hydrogen atom and nitrogen atom as main constituents is sufficient. However, from the standpoint of process stability and the like, containing a gas species having a nitrogen-hydrogen bond such as ammonia or hydrazine as a main component is favorable.

When the plasma nitridation treatment of titanium film 106 in FIG. 19 is completed, the application of the high-frequency voltage is stopped, and with no change in other states (a third non-plasma reducing vapor phase atmosphere), the step moves to the reduction heat treatment after titanium nitridation 107 in FIG. 19. The reduction heat treatment after titanium nitridation time is, for example, around 60 seconds. As a favorable range, around 10 seconds to 90 seconds may be exemplified. For the atmosphere of the reduction heat treatment after titanium nitridation 107, the wholly same content can be said as that in the aforementioned reduction heat treatment prior to titanium film-forming 101 and reduction heat treatment after titanium film-forming 105. Meanwhile, this process is not indispensable when the reduction heat treatment prior to titanium film-forming 101 is performed, but, by performing it, further effect may be expected for lowering the contact resistance and the like. When being compared with the contribution of the reduction heat treatment after titanium film-forming 105, for the same time period, the reduction heat treatment after titanium film-forming 105 represents a somewhat greater improvement effect. However, when performing this treatment in combination with the reduction heat treatment prior to titanium film-forming 101 and the reduction heat treatment after titanium film-forming 105, a lowering effect particularly in the contact resistance and the like is great. Further, since the reduction heat treatment after titanium nitridation 107 is performed through the titanium nitride film, it has such merit that there is no unintended side effect such as resistance increase by nitridation of the nickel silicide and the like. Accordingly, it can be performed for a relatively long time.

When the reduction heat treatment after titanium nitridation 107 in FIG. 19 is completed, further, the introduction of the NH$_3$ gas into the chamber 56 is also stopped, and the NH$_3$ gas is exhausted from the chamber 56. When the gas substitution to an argon and hydrogen atmosphere is completed, for a base tungsten film formation 108 and a main tungsten CVD film formation 109 in FIG. 19, as shown in FIG. 10, the wafer SW is transferred from the titanium CVD chamber 56 to the tungsten CVD chamber 57 by the vacuum transfer robot 61 via the vacuum transferring chamber 51.

According to the aforementioned film-forming method, a barrier metal film 21 constituted of the heat reaction Ti film 21a/plasma reaction Ti film 21b/nitrogen-rich TiN film 21c is formed. The heat reaction Ti film 21a has a thickness of, for example, 1 nm or less, the plasma reaction Ti film 21b has a thickness of, for example, 1 to 3 nm, and the nitrogen-rich TiN film 21c has a thickness of, for example, 1 to 3 nm.

The heat reaction Ti film 21a can give a low contact resistance with the nickel silicide layer 14. The reason may be that (1) (Ni$_1$Ti$_{1-x}$)Si is generated at the interface between the nickel silicide layer 14 and the heat reaction Ti film 21a, (2) the nickel silicide acts as a catalyst to generate pure titanium by a heat decomposition reaction and the film contains impurities in a smaller concentration as compared with the plasma reaction Ti film 21b, (3) ultratrace fluorine remaining after the dry cleaning treatment reduces titanium chloride, or the like. Further, the nitrogen-rich TiN film 21c is effective as a barrier film that suppresses or prevents the diffusion of a constitutional atom of the plug. Furthermore, the plasma treatment 104 in FIG. 19 lowers the concentration of impurities of the plasma reaction Ti film 21b such as chlorine. Furthermore, it is possible to allow an ammonia molecule, a hydrogen molecule, a hydrogen atom or the like to pass through the plasma reaction Ti film 21b and reduce the oxide film remaining between the plasma reaction Ti film 21b and the nickel silicide layer 14 at the bottom portion of the first and second wiring grooves HM1 and HM2, after forming a heat reaction Ti film 21a/plasma reaction Ti film 21b, subjecting the product to a plasma treatment using $H_2$ gas, and further subjecting the surface of the plasma reaction Ti film 21b to a heat nitridation treatment using $NH_3$ gas and a plasma treatment using $NH_3$ gas.

As described above, since the barrier metal film 21 with a low concentration of impurities such as chlorine can be formed, it is possible to lower the resistance of the nickel silicide layer 14, and, further, prevent the peeling, micro cracks and the like of the barrier metal film 21. Further, it is possible to reduce the oxide film remaining between the plasma reaction Ti film 21b and the nickel silicide layer 14 at the bottom portion of the first and second wiring grooves HM1 and HM2.

Next, as shown in FIG. 13, over the contact hole C1, and the barrier metal film 21 including the inside of the first and second wiring grooves HM1 and HM2, a metal film, for example, a tungsten film 22 is deposited by a CVD method. In forming the tungsten film 22, firstly, a nuclear film of tungsten (hereinafter, written as a tungsten nuclear film) 22a is formed over the barrier metal film 21, and, after that, a tungsten film (hereinafter, written as a blanket tungsten film) 22b to be embedded into the inside of the contact hole C1, and the first and second wiring grooves HM1 and HM2 is deposited. In the present embodiment, the tungsten nuclear film 22a is made into a multi-layer structure having a thickness of, for example, 0.01 μm (10 nm) or less. Since the tungsten nuclear film 22a has a good adhesiveness with the nitrogen-rich TiN film 21c lying at the upper most layer of the barrier metal film 21, and has a function of suppressing or preventing the penetration of fluorine, which is contained in $WF_6$ gas being a film-forming gas of the tungsten film, into the barrier metal film 21, corrosion of the barrier metal film 21 by fluorine (for example, blister, peeling or the like of the plasma reaction Ti film 21b) can be prevented.

The tungsten layer is formed, for example, as follows.

Firstly, the base tungsten film formation 108 in FIG. 19 is performed. That is, $WF_6$ gas (for example, around 50 sccm), $SiH_4$ gas (for example, around 40 sccm) and $H_2$ gas (for example, around 900 sccm) are introduced into the chamber 57 (FIG. 10) in a prescribed flow volume, respectively, to form the tungsten nuclear film 22a having a prescribed thickness at the surface of the barrier metal film 21. The pressure in the chamber 57 is set to, for example, 2667 Pa, and the temperature of the semiconductor wafer is set to, for example, 390° C. Further, by controlling the treatment time, the tungsten nuclear film 22a having an intended thickness is formed. The thickness of the tungsten nuclear film 22a is, for example, 7 nm. On this occasion, the treatment time is around several seconds. By simultaneously introducing $WF_6$ gas and $SiH_4$ gas into the chamber, fluorine can be removed at the same time as the film-forming, and therefore the tungsten nuclear film 22a with small fluorine content can be formed.

When the base tungsten film formation 108 in FIG. 19 is completed, next, the main tungsten CVD film formation 109 in FIG. 19 is started. That is, after introducing $H_2$ gas into the chamber 57 (FIG. 10) in a prescribed flow volume (for example, around 2200 sccm), $WF_6$ gas is introduced into the chamber 57 in a prescribed flow volume, for example, 250 sccm to form a blanket tungsten film 22b by $H_2$ reduction over the tungsten nuclear film 22a. The pressure in the chamber 57 is set to, for example, 10666 Pa, and the temperature of the semiconductor wafer is set to 400° C. or less, for example, 390° C. Further, by controlling the treatment time, the blanket tungsten film 22b having an intended thickness is formed. The blanket tungsten film 22b has a thickness of, for example, 0.193 μm (193 nm). On this occasion, the film-forming time is around 35 seconds to 40 seconds.

By the film-forming method adopting the nucleation by $SiH_4$ reduction, the tungsten film 22 made of the tungsten nuclear film 22a and the blanket tungsten film 22b with small fluorine content is formed. The temperature of forming the blanket tungsten film 22b is, for example, 390° C., wherein, by forming the tungsten film 22 at relatively low temperatures of not more than 400° C., the penetration of fluorine contained in $WF_6$ gas upon forming the blanket tungsten film 22b can be suppressed. As the result, the penetration of fluorine contained in the $WF_6$ gas into the barrier metal film 21 can be suppressed or prevented, and the corrosion of the barrier metal film 21 by fluorine can be prevented.

FIG. 14(a) is a cross-sectional view of the essential part of the same place as that in FIG. 3(a) in a manufacturing process subsequent to FIG. 13, and FIG. 14(b) is a cross-sectional view of the essential part of the same place as that in FIG. 3(b) in a manufacturing process subsequent to FIG. 13.

Next, as shown in FIGS. 14(a) and 14(b), by performing etch back or CMP until the surface of the silicon oxide film 17 is exposed, the titanium film, titanium nitride film and tungsten film outside the contact hole C1, and the first and second wiring grooves HM1 and HM2 are removed to form a plug P1 containing the tungsten film 22 as a main electroconductive material inside the contact hole C1, and local wirings 23a (see FIG. 15) and 23b inside the first and second wiring grooves HM1 and HM2.

The local wiring 23a is coupled to the lead portion GM2 of the gate electrode G that is common to the drain of the MISFET for load (Ld1), the source of the MISFET for transfer (Tr1), and the MISFET for load (Ld2) and MISFET for drive (Dr2) constituting the CMOS inverter INV2. The local wiring 23b is coupled to the lead portion GM1 of the gate electrode G common to the drain of the MISFET for load (Ld2), the source of the MISFET for transfer (Tr2), and the MISFET for load (Ld1) and MISFET for drive (Dr1) constituting the CMOS inverter INV1.

In the aforementioned process of forming the plug P1 inside the contact hole C1, and the first and second wiring grooves HM1 and HM2, the tungsten film 22 is used as a main electroconductive material of the plug P1, and the barrier metal film 21 is formed as a laminated film including the titanium nitride film 21c formed over titanium films 21a and 21b, but the system is not limited to this, and various changes are possible. For example, it is also possible to use the aforementioned laminated film including the titanium nitride film 21c formed over the titanium films 21a and 21b as the barrier metal film 21, and a copper film as a main electroconductive material of the plug. On this occasion, firstly, the barrier metal film 21 is formed by a manufacturing method substantially the same as aforementioned one, and, after that, a seed layer, for example, a seed layer of copper or ruthenium is formed over the barrier metal film 21 by a CVD method or sputtering method, and, further, a copper plating film is formed over the seed layer using an electrolytic plating method, to embed the copper plating film inside the contact hole C1, and the first and second wiring grooves HM1 and HM2.

For forming the barrier metal film 21 and the seed layer, the aforementioned film forming apparatus 50 is used. As described above, the transferring chamber 51 of the film forming apparatus 50 is provided with four chambers, and, when using the tungsten film 22 as a main electroconductive material of the plug P1, the chamber 54 is used as a chamber for a dry cleaning procedure, the chamber 55 as a chamber for a heat treatment, the chamber 56 as a chamber for forming a barrier metal film, and the chamber 57 as a tungsten CVD chamber. When a copper film is used as a main electroconductive material of the plug P1, the chamber 54 is used as a chamber for a dry cleaning treatment, the chamber 55 as a chamber for a heat treatment, the chamber 56 as a chamber for forming the barrier metal film, and the chamber 57 as a chamber for forming the seed layer. This enables the seed layer to be continuously formed over the barrier metal film 21 without pollution of the surface of the barrier metal film 21 caused by the exposure to the air, and the seed layer to be formed uniformly. After that, a copper film is embedded inside the contact hole C1, and the first and second wiring grooves HM1 and HM2 by an electrolytic plating method, wherein, since the seed layer is formed uniformly, the copper film is embedded approximately completely to give a good conduction state of the plug P1.

3. Explanation of a back end portion of a wafer process in the method of manufacturing a semiconductor integrated circuit device of one embodiment of the application, a CMIS SRAM being one example of the target devices and the like (mainly FIGS. 15 to 18(b)). After that, upper layer wiring, for example, a zeroth, first and second layer wirings are formed. Continuously, a formation process of these wirings will be described.

FIG. 15 is a plan view of the essential part of the same place as that in FIG. 2 in a manufacturing process subsequent to FIGS. 14(a) and 14(b), FIG. 16(a) is a cross-sectional view of the essential part of the same place as that in FIG. 3(a) in a manufacturing process subsequent to FIGS. 14(a) and 14(b), and FIG. 16(b) is a cross-sectional view of the essential part of the same place as that in FIG. 3(b) in a manufacturing process subsequent to FIGS. 14(a) and 14(b).

Firstly, a tungsten film having a thickness of, for example, around 0.1 µm (100 nm) is deposited over the local wirings 23a and 23b, and plug P1 by a sputtering method, subsequently, and patterned to form a 0th layer wiring M0.

Next, the silicon oxide film 24 is deposited over the local wirings 23a and 23b, the 0th layer wiring M0 and the silicon oxide film 17 by a CVD method. Subsequently, the silicon oxide film 24 over the 0th layer wiring M0 is removed by etching to form a via hole C2.

Next, a barrier metal film 25 is formed over the silicon oxide film 24 including the inside of the via hole C2. The barrier metal film 25 is, for example, a titanium nitride film, a tantalum nitride film, a laminated film formed by stacking a tantalum film over a tantalum nitride film, or a laminated film formed by stacking a ruthenium film over a tantalum nitride film. Before forming the barrier metal film 25, the aforementioned dry cleaning treatment is performed, and, also in the dry cleaning treatment, after that, the aforementioned heating at a temperature of 100 to 150° C. and heating at a temperature of 150° C. or higher may be performed to the semiconductor wafer to remove the product generated at the bottom face and side face of the via hole C2. This can lower the variation of the contact resistance between the barrier metal film 25 and the 0th layer wiring M0, and prevent the peeling of the barrier metal film 25 from the silicon oxide film 24.

Next, the seed layer of copper is formed over the barrier metal film 25 by a CVD method or sputtering method, and, further, a copper plating film is formed over the seed layer using an electrolytic plating method. The inside of the via hole C2 is embedded with the copper plating film. Subsequently, the copper plating film, seed layer and barrier metal film 25 in regions other than the via hole C2 are removed by a CMP method to form a plug P2 having a copper film as a main electroconductive material. Note that, in the plan view of FIG. 15, showing of the gate electrode G, active region An1 and the like is omitted.

Next, the first layer wiring (denoted by hatching of mesh in FIG. 15) M1 is formed over the silicon oxide film 24 and the plug P2. Firstly, for example, a titanium film having a thickness of around 0.01 µm (10 nm) and a titanium nitride film having a thickness of around 0.05 µm (50 nm) are successively deposited by a sputtering method. Subsequently, by depositing a tungsten film by a CVD method and patterning the film, the first layer wiring M1 is formed. In the first layer wiring M1, the first layer wiring M1 coupling the gate electrodes G of MISFETs for transfer (Tr1, Tr2) via plugs P1 and P2 constitutes a word line WL.

Figure 17:
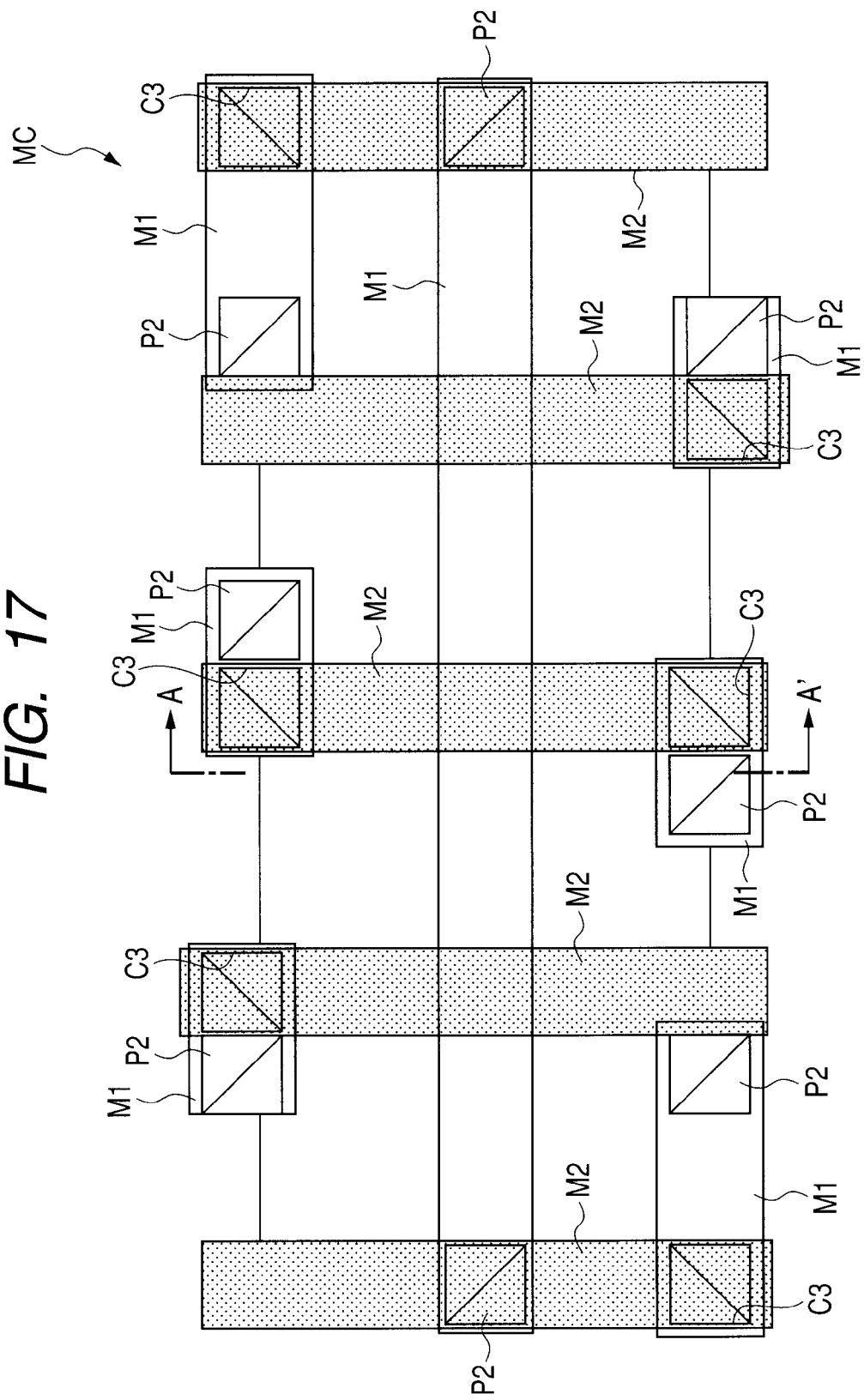
FIG. 17 is a plan view of the essential part of the same place as that in FIG. 2 in a manufacturing process subsequent to FIGS. 15, 16(a) and 16(b)
Figure 18:
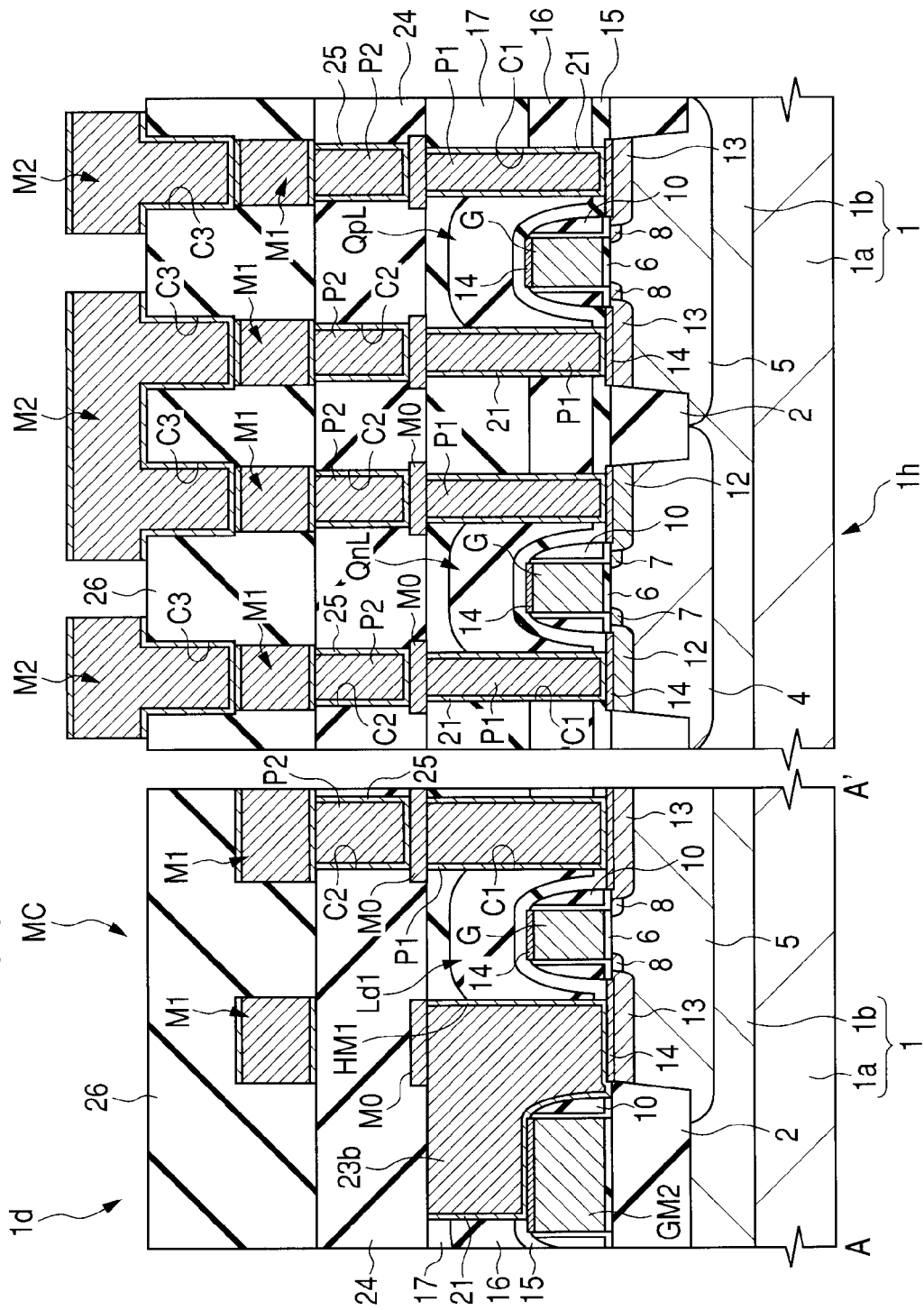
FIGS. 18(a) and 18(b) are cross-sectional views of the essential part of the same place as that in FIGS. 3(a) and 3(b) in a manufacturing process subsequent to FIGS. 15, 16(a) and 16(b)

FIG. 17 is a plan view of the essential part of the same place as that in FIG. 2 in a manufacturing process subsequent to FIGS. 15 to 16(b), FIG. 18(a) is a cross-sectional view of the essential part of the same place as that in FIG. 3(a) in a manufacturing process subsequent to FIGS. 15 to 16(b), and FIG. 18(b) is a cross-sectional view of the essential part of the same place as that in FIG. 3(b) in a manufacturing process subsequent to FIGS. 15 to 16(b).

After depositing the silicon oxide film 26 over the first layer wiring M1 and silicon oxide film 24 by a CVD method, the silicon oxide film 26 over the first layer wiring M1 is removed by etching to form a via hole C3.

Next, the second layer wiring (shown by a hatching of mesh in FIG. 17) M2 is formed over the silicon oxide film 26. Firstly, for example, a titanium film having a thickness of around 0.01 µm (10 nm) and a titanium nitride film having a thickness of around 0.05 µm (50 nm) are successively deposited by a sputtering method. Subsequently, by depositing a tungsten film by a CVD method and patterning the film, the second layer wiring M2 is formed. To the source of MISFETs for drive (Dr1, Dr2), reference electric potential Vss is supplied via the second layer wiring M2. Further, to the source of MISFETs for load (Ld1, Ld2), power supply potential Vcc is supplied via the second layer wiring M2. The second layer wiring M2 coupled to one edge of MISFETs for drive (Dr1, Dr2) constitutes data lines DL and /DL.

By processes described above, the memory cell MC and a peripheral circuit of the SRAM described using FIG. 1 are approximately completed.

4. Consideration for a main portion of the wafer process in the method of manufacturing a semiconductor integrated circuit device of one embodiment of the application, and explanation of data and the like (mainly FIGS. 20 to 23)

As described above, according to the present embodiment, although a product having a composition slightly deviating from the stoichiometric composition remains at the bottom face and side face of the contact hole C1, and the first and second wiring grooves HM1 and HM2 by the dry cleaning procedure (a treatment in the chamber 54 in FIG. 10) performed prior to the formation of the barrier metal film 21 inside the contact hole C1, and the first and second wiring grooves HM1 and HM2, the product is removed by a heat treatment of a temperature higher than 150° C. performed after the dry cleaning treatment. Therefore, the variation of the contact resistance between the nickel silicide layer 14 and barrier metal film 21 at the bottom portion of the contact hole C1, and the first and second wiring grooves HM1 and HM2 can be lowered, and the peeling of the barrier metal film 21 at the side face of the contact hole C1, and the first and second wiring grooves HM1 and HM2 can be prevented.

Further, since the heat reaction Ti film 21a containing a low concentration of impurities such as chlorine is formed at the lowermost layer contacting the nickel silicide layer 14 of the barrier metal film 21, and the concentration of impurities such as chlorine contained in the barrier metal film 21 can be lowered by a plasma treatment using $H_2$ gas, the barrier metal film 21 having a low contact resistance with the nickel silicide layer 14 and having no defect such as peeling or micro cracks can be obtained. Further, by forming the nitrogen-rich TiN film 21c at the uppermost layer contacting the plug of the barrier metal film 21, diffusion of constitutional atoms of the plug can be suppressed or prevented.

Further, an oxide film may grow at the surface of the nickel silicide layer 14, and occasionally remain because the film cannot be removed by the dry cleaning treatment and heat treatment (treatments in chambers 54 and 55 in FIG. 10). However, after forming the heat reaction Ti film 21a/plasma reaction Ti film 21b, the product is subjected to a plasma treatment using $H_2$ gas, and, further, the surface of the plasma reaction Ti film 21b is subjected to a heat nitridation treatment using $NH_3$ gas and a plasma treatment using $NH_3$ gas. This enables an H atom to pass through the plasma reaction Ti film 21b to reduce an oxide film remaining between the plasma reaction Ti film 21b and nickel silicide layer 14 at the bottom face of the first and second wiring grooves HM1 and HM2, and good conduction between the plug P1 and nickel silicide layer 14 can be obtained. Note that, when performing the reduction heat treatment prior to titanium film-forming 101 (FIG. 19), various kinds of reducing treatments (the halogen removal plasma treatment 104, reduction heat treatment after titanium film-forming 105, and plasma nitridation treatment of titanium film 106) after the treatment 101 is not indispensable for the purpose of removing an oxide film of the surface of the nickel silicide layer 14 (after forming the titanium film, including an oxide in the titanium film). However, performing any one of, or a multiple number of, or the whole of these post-reducing treatments is effective for further lowering the contact resistance and the like.

Figure 21:
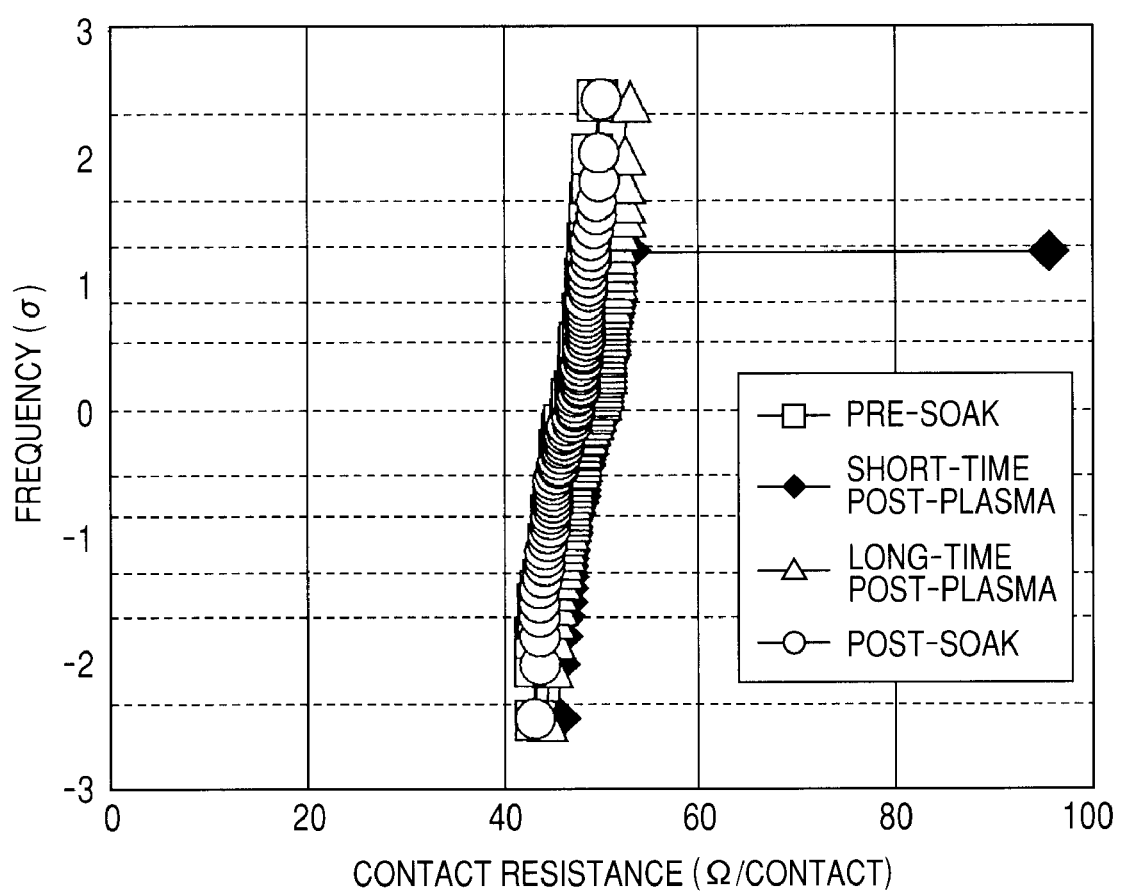
FIG. 21 is a data plot view showing the distribution of the contact resistance by various treatments for the periphery of a barrier metal film formation.

FIG. 21 shows the contact resistance between the plug and the nickel silicide layer when the invention is implemented (including treatments under various kinds of conditions for comparison). For measuring the contact resistance, a chain structure pattern of the plug and the nickel silicide layer having 7200 connections embedded in a wiring groove having a long side diameter of 200 nm and a short side diameter of 90 nm. By applying a heat treatment using $NH_3$ gas and the like, the contact resistance between the plug and nickel silicide layer is lowered, as shown in FIG. 21 as pre-soak.

Figure 20:
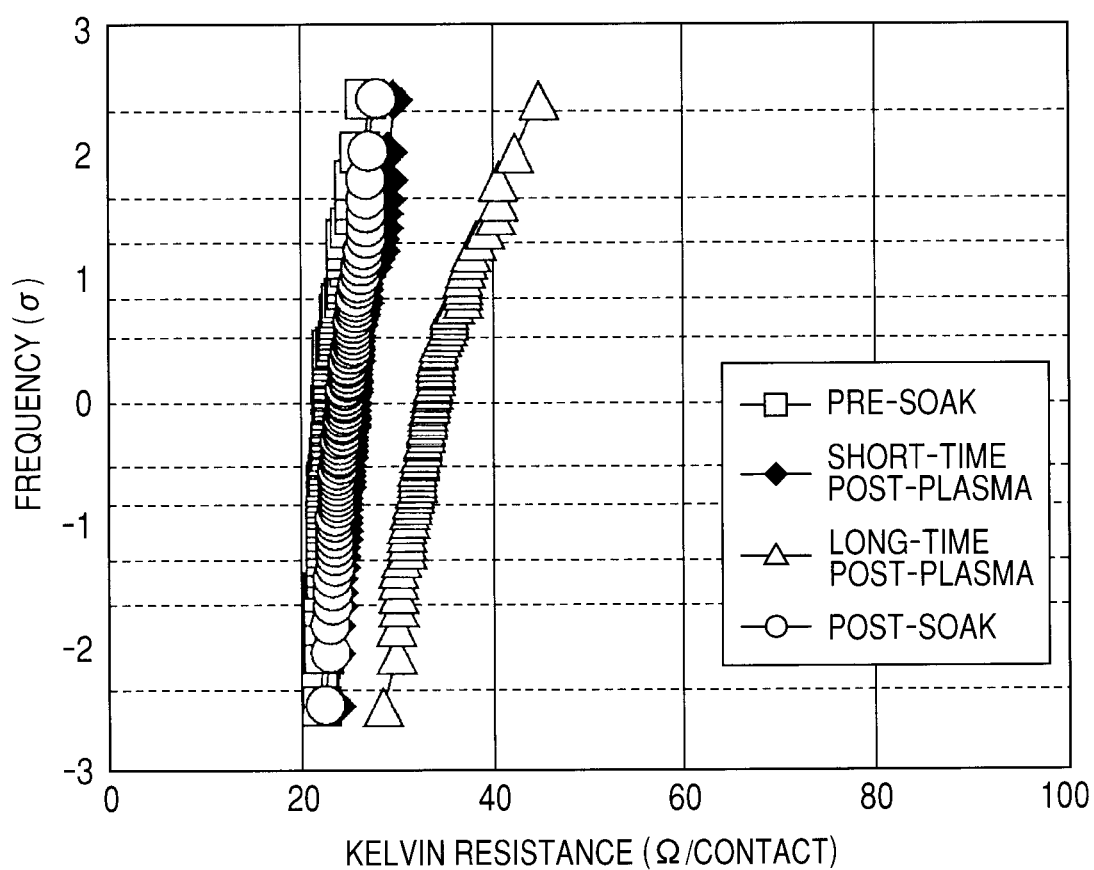
FIG. 20 is a data plot view showing the distribution of the Kelvin resistance at a contact portion by various treatments for the periphery of a barrier metal film formation.

Further, FIG. 20 shows the distribution of the plug resistance measured using a 4-terminal method, that is, Kelvin resistance when the invention is implemented. For measuring the Kelvin resistance, a structure pattern of the plug and nickel silicide layer having one connection embedded in an approximately circular contact hole having a diameter of around 80 nm was used. Meanwhile, the Kelvin resistance depends on the hole diameter, and it is around 20 to 30 ohm/contact when the diameter is around 80 nm, but is around 30 to 40 ohm/contact when the diameter becomes around 60 nm. Further, when the diameter becomes around 40 nm, it becomes around 60 to 70 ohm/contact.

Treatment conditions for respective samples (samples are put in quotation marks to be distinguished from the treatment) in FIGS. 20 and 21 are summarized below. All four cases are treated according to the condition described in Section 2. That is, basically, the base titanium film formation 102, main titanium CVD film formation 103, halogen removal plasma treatment 104, reduction heat treatment after titanium film-forming 105, and plasma nitridation treatment of titanium film 106 in FIG. 19, respectively, are treated under the same condition. Note that, the reduction heat treatment after titanium nitridation 107 is not performed. But, only the "long-time post-plasma" has a slightly long post-plasma nitridation treatment time (plasma nitridation treatment of titanium film 106) of 60 seconds. The reduction heat treatment prior to titanium film-forming 101 is applied only to the "pre-soak." Further, only for the "post-soak," the post-soak treatment (reduction heat treatment after titanium film-forming 105) is applied, wherein, since there is no pre-soak treatment, the time is set to slightly longer (around 60 seconds) as compared with that in the aforementioned embodiment.

From data in FIGS. 20 and 21, the following can be read out. (1) From the data of the "long-time post-plasma" in FIG. 20, the long-time post-plasma nitridation treatment raises the Kelvin resistance. It is considered to be the rise in electric resistance caused by nitridation of the boundary face. This can be read out also from FIG. 21, although the degree is small. (2) In the data of the "short-time post-plasma", 1.5 σ or more leads to non-conduction. This shows that a silicon oxide film near the upper surface of the nickel silicide film is not sufficiently removed. (3) Accordingly, in order to lower the resistance of contact portions, the pre-soak treatment is most effective, and, in addition to this, the post-soak treatment and post-plasma nitridation treatment are effective.

Further, the formation of a multi-structure tungsten nuclear film 22a at a layer contacting the barrier metal film 21 of the tungsten film 22 constituting the plug by a $SiH_4$ reduction reaction or $B_2H_6$ reduction reaction can give good adhesiveness between the tungsten film 22 and the nitrogen-rich TiN film 21c. Further, since the tungsten nuclear film 22a has a function of suppressing the penetration of fluorine contained in $WF_6$ gas, and the tungsten film 22 can be formed at a relatively low temperature of 400° C. or less by adopting the formation of the blanket tungsten film 22b by $H_2$ reduction, the penetration of fluorine contained in $WF_6$ gas into the barrier metal film 21 can be suppressed or prevented, and corrosion of the barrier metal film 21 caused by fluorine can be prevented.

Further, when a plug made of copper is used as a conductive member to be embedded into the inside of the contact hole C1, and the first and second wiring grooves HM1 and HM2, by providing the chamber for a dry cleaning procedure (chamber 54), the chamber for a heat treatment (chamber 55), the chamber for forming a barrier metal film (chamber 56), and the chamber for forming a seed layer (chamber 57) at the film forming apparatus 50, the seed layer can be formed sequentially over the barrier metal film 21 without the exposure to the air. Therefore, the seed layer is formed uniformly to enable a copper film to be embedded approximately completely into the inside of the contact hole C1, and the first and second wiring grooves HM1 and HM2 by an electrolytic plating method, and to give a good conduction state of the plug P1.

Figure 22:
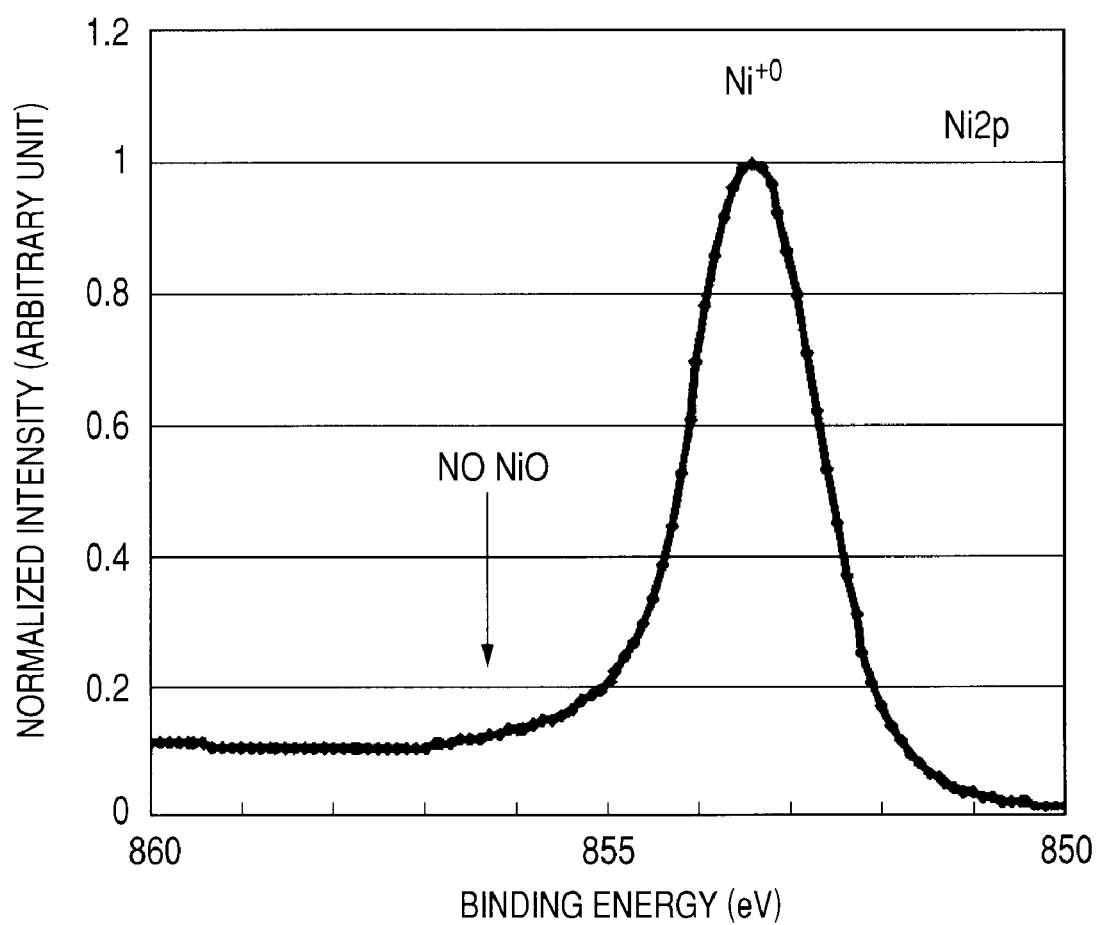
FIG. 22 is a spectroscopic data plot view by XPS, that is, (X-ray Photoelectron Spectroscopy) for verifying the existence of nickel oxide in the natural oxide film of the upper surface of the nickel silicide film.
Figure 23:
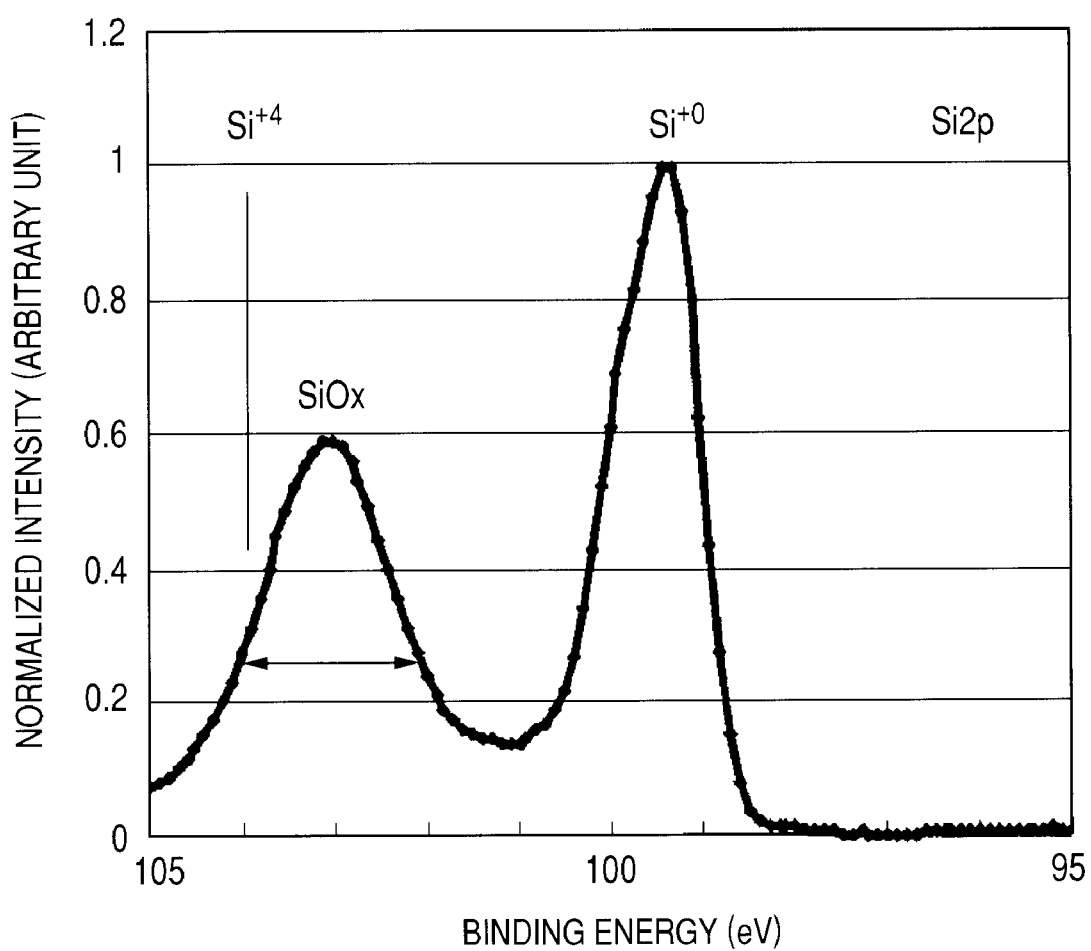
FIG. 23 is a spectroscopic data plot view by X-ray photoelectron spectroscopy for verifying the existence of oxidized silicon in the natural oxide film of the upper surface of the nickel silicide film.

Next, a removal mechanism of the natural oxide film of the nickel silicide film upper surface and the like by the reduction treatment (the reduction heat treatment prior to titanium film-forming 101 (FIG. 19)) is considered. FIG. 22 is a spectroscopic data plot view by XPS, that is, X-ray photoelectron spectroscopy for verifying the existence of an oxidized nickel in the natural oxide film of the nickel silicide film upper surface. FIG. 23 is a spectroscopic data plot view by X-ray photoelectron spectroscopy for verifying the existence form of an oxidized silicon in the natural oxide film of the nickel silicide film upper surface.

Firstly, as shown in FIG. 22, it is understood that absolutely no signal is output from the nickel silicide film upper surface regarding oxidized nickel. Accordingly, the natural oxide film can be supposed to be an oxidized silicon. Further, as shown in FIG. 23, it is understood that, at the position for silicon dioxide on the left side, a broad and low peak appears and a sharp peak, which appears for usual silicon dioxide films, does not exist. From this result, the natural oxide film is supposed to be not of a stoichiometric $SiO_2$, but is a non-stoichiometric silicon dioxide film (one to be written as SiOx). This relates to the fact that the natural oxide film has not been exposed to a heat treatment of 600° C. or more.

In a usual non-plasma atmosphere, ammonia gas (or hydrazine vapor) has no ability of removing stoichiometric silicon dioxide members, but, when the natural oxide film is a non-stoichiometric silicon dioxide film, there is possibility of removing it. Further, there is possibility of further improvement of the removing ability by the contribution of a catalytic action of a refractory metal such as nickel in nickel silicide or titanium in the barrier metal. The nitrogen-hydrogen bond in ammonia gas and the like is weaker as compared with a carbon-hydrogen bond of usual organic substances (hydrogen carbide) and the like, hydrogen is considered to be released easily. As described above, by subjecting the nickel-based metal silicide film upper surface to a reduction heat treatment in a non-plasma atmosphere containing ammonia gas or the like as a main component before forming a titanium film, it becomes possible to effectively remove the natural oxide film, while avoiding charge up damage by the plasma and increase in the resistance caused by nitridation.

Further, by performing a reduction heat treatment in a non-plasma atmosphere containing ammonia gas or the like as a main component after forming a titanium film, after nitriding titanium, or the like, it is possible to remove an oxygen component contained in the nickel-based metal silicide film upper surface (one that remains after a reduction treatment before forming a titanium film, or one generates after that) and the titanium film, and to form a contact structure with more stability and lower resistance.

5. Summary

Until here, the invention achieved by the present inventor has specifically been described on the basis of embodiments, but, needless to say, the invention of the application is not limited to it, but it can be variously changed within a range that does not depart from the gist thereof.

For example, in the above embodiment, a general-purpose SRAM was used as an example and specifically explained, but the invention of the application is not limited to it, and, needless to say, it can be also applied to embedded SRAMs, general SOC devices, and the like.

Further, in the above embodiment, the description was focused on a shared contact portion, in which contact resistance failure easily occurs in particular, but the invention of the application is not limited to it, and, needless to say, the invention is also effective when being applied to usual contact holes having an approximately circular planar shape, by miniaturization, as described also in Section 4.

Further, in the above embodiment, the description of the back end process was focused on a copper-based damascene process, specifically, the invention of the application is not limited to it, but, needless to say, it can also be applied to a process using an aluminum-based, usually multi-layer wiring (non-embedded wiring, that is, subtractive wiring) process.

What is claimed is:

1. A method of manufacturing a semiconductor integrated circuit device comprising the steps of:

(a) forming a pre-metal insulating film over a device surface of a semiconductor wafer via an etch stop insulating film;

(b) opening a contact hole passing through the pre-metal insulating film and the etch stop insulating film;

(c) performing a heat treatment for the upper surface of a nickel-based metal silicide film at the bottom of the contact hole in a first non-plasma reducing vapor phase atmosphere containing a gas having a nitrogen-hydrogen bond as one of main gas components;

(d) after the step (c), forming a titanium-based barrier metal film at the upper surface of the pre-metal insulating film and the inner surface of the contact hole;

(e) forming a plug metal layer over the upper surface of the pre-metal insulating film and the titanium-based barrier metal film of the inner surface of the contact hole; and (f) removing the titanium-based barrier metal film and the plug metal layer outside the contact hole.

2. The method of manufacturing a semiconductor integrated circuit device according to claim 1, wherein the gas having a nitrogen-hydrogen bond is ammonia gas.

3. The method of manufacturing a semiconductor integrated circuit device according to claim 2, wherein the first non-plasma reducing vapor phase atmosphere contains hydrogen gas as one of main components.

4. The method of manufacturing a semiconductor integrated circuit device according to claim 2, wherein the first non-plasma reducing vapor phase atmosphere contains hydrogen gas as the most plentiful component.

5. The method of manufacturing a semiconductor integrated circuit device according to claim 4, wherein the first non-plasma reducing vapor phase atmosphere contains an inert gas as one of main components.

6. The method of manufacturing a semiconductor integrated circuit device according to claim 4, wherein the first non-plasma reducing vapor phase atmosphere contains argon gas as one of main components.

7. The method of manufacturing a semiconductor integrated circuit device according to claim 6, wherein the first non-plasma reducing vapor phase atmosphere does not substantially contain any of oxygen gas, halogen gas, and organic gas.

8. The method of manufacturing a semiconductor integrated circuit device according to claim 2, wherein the plug metal layer includes a tungsten-based metal layer as a main constituent.

9. The method of manufacturing a semiconductor integrated circuit device according to claim 1, wherein the gas having a nitrogen-hydrogen bond is ammonia gas is hydrazine gas.

10. The method of manufacturing a semiconductor integrated circuit device according to claim 1, wherein the step (d) includes the substeps of:

(d1) after the step (c), forming a titanium-based metal film at the upper surface of the pre-metal insulating film and the inner surface of the contact hole, and (d2) forming a titanium nitride film at the upper surface of the titanium-based metal film by performing a plasma nitridation treatment at the upper surface of the titanium-based metal film.

11. The method of manufacturing a semiconductor integrated circuit device according to claim 10, wherein the step (c) and the substep (d1) are performed over a first wafer stage in a first CVD treatment chamber.

12. The method of manufacturing a semiconductor integrated circuit device according to claim 11, wherein the step (c) and the substep (d2) are performed over the first wafer stage in the first CVD treatment chamber.

13. The method of manufacturing a semiconductor integrated circuit device according to claim 12, wherein the step (d) further includes the substep of
(d3) after the substep (d1) and before the substep (d2), performing a heat treatment for the upper surface of the nickel-based metal silicide film via the titanium-based metal film in a second non-plasma reducing vapor phase atmosphere containing a gas having a nitrogen-hydrogen bond as one of main gas components.

14. The method of manufacturing a semiconductor integrated circuit device according to claim 13, wherein the step (c) and the substep (d3) are performed over the first wafer stage in the first CVD treatment chamber.

15. The method of manufacturing a semiconductor integrated circuit device according to claim 14, wherein the step (d) further includes the substep of
(d4) after the substep (d1) and before the substep (d3), performing a vapor phase plasma treatment with hydrogen gas as a main component for the device surface side of the semiconductor wafer.

16. The method of manufacturing a semiconductor integrated circuit device according to claim 15, wherein the step (c) and the substep (d4) are performed over the first wafer stage in the first CVD treatment chamber.

17. The method of manufacturing a semiconductor integrated circuit device according to claim 10, wherein the substep (d1) is performed by a plasma CVD method.

18. The method of manufacturing a semiconductor integrated circuit device according to claim 17, wherein the step (d) further includes the substep of
(d5) after the step (c) and before the substep (d1), performing a treatment approximately the same as that in the substep (d1) in a state of applying no plasma.

19. The method of manufacturing a semiconductor integrated circuit device according to claim 18, wherein the step (c) and the substep (d5) are performed over the first wafer stage in the first CVD treatment chamber.

20. The method of manufacturing a semiconductor integrated circuit device according to claim 1, wherein a contact structure formed in the contact hole is a shared contact.

* * * * *